(12) United States Patent
Vellianitis

(10) Patent No.: US 12,720,759 B2
(45) Date of Patent: Aug. 25, 2026

(54) FERROELECTRIC DEVICES AND METHODS OF FORMING THE SAME

(71) Applicant: TAIWAN SEMICONDUCTOR MANUFACTURING COMPANY, LTD., Hsinchu (TW)

(72) Inventor: Georgios Vellianitis, Heverlee (BE)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 929 days.

(21) Appl. No.: 17/850,429

(22) Filed: Jun. 27, 2022

(65) Prior Publication Data

US 2023/0301114 A1 Sep. 21, 2023

Related U.S. Application Data

(60) Provisional application No. 63/319,842, filed on Mar. 15, 2022.

(51) Int. Cl.
*H10D 64/01* (2025.01)
*H10B 53/30* (2023.01)
(Continued)

(52) U.S. Cl.
CPC ......... *H10B 53/30* (2023.02); *H10D 30/0415* (2025.01); *H10D 30/701* (2025.01); *H10D 64/017* (2025.01); *H10W 20/435* (2026.01)

(58) Field of Classification Search
CPC ......... H01L 21/02321; H01L 21/02356; H01L 21/31155; H01L 21/02181;
(Continued)

(56) References Cited

U.S. PATENT DOCUMENTS 6,125,027 A * 9/2000 Klee ................... C03C 17/3642 361/308.1
11,227,872 B2 1/2022 Chang et al.
(Continued)

FOREIGN PATENT DOCUMENTS

CN 112635670 A * 4/2021 ............. H10D 1/692
JP 2006080133 A 3/2006
JP 2014053568 A 3/2014

OTHER PUBLICATIONS

Hara et al 2021 Jpn. J. Appl. Phys. 60 SFFB05, doi: 10.35848/1347-4065/ac1250 (Year: 2021).*
(Continued)

*Primary Examiner* — William B Partridge
*Assistant Examiner* — Ilker Ozden
(74) *Attorney, Agent, or Firm* — NZ Carr Law Office

(57) ABSTRACT

A ferroelectric device and methods of forming the same are described. In some embodiments, the method includes depositing a doped hafnium dioxide layer on a layer, and the doped hafnium dioxide layer has a first oxygen vacancy concentration. The method further includes performing an ultra-high vacuum anneal process on the doped hafnium dioxide layer to increase the first oxygen vacancy concentration to a second oxygen vacancy concentration and performing an oxygen anneal process on the doped hafnium dioxide layer to decrease the second oxygen vacancy concentration.

20 Claims, 17 Drawing Sheets

(51) Int. Cl.
*H10D 30/01* (2025.01)
*H10D 30/69* (2025.01)
*H10W 20/41* (2026.01)

(58) Field of Classification Search
CPC ... H01L 21/02194; H10B 51/30; H10B 53/30; H10D 64/033; H10D 64/689; H10D 30/0415; H10D 30/701; H10D 64/017; H10D 1/68; H10W 20/435; H10P 14/6518; H10P 30/40; H10P 14/6544; H10P 14/69392; H10P 14/69397
See application file for complete search history.

(56) References Cited

U.S. PATENT DOCUMENTS

| | | | | |
|---|---|---|---|---|
| 11,527,552 | B2 | 12/2022 | Lu et al. | |
| 2014/0175367 | A1* | 6/2014 | Tendulkar | H10N 70/883 257/4 |
| 2019/0019683 | A1* | 1/2019 | Yoo | H10D 64/033 |
| 2019/0148390 | A1* | 5/2019 | Frank | H01L 21/02194 257/295 |
| 2020/0343265 | A1* | 10/2020 | Chang | H10D 64/033 |
| 2021/0074727 | A1* | 3/2021 | Prasad | H10B 51/30 |
| 2021/0175342 | A1 | 6/2021 | Lu et al. | |
| 2021/0202508 | A1* | 7/2021 | Jeon | H10D 1/68 |
| 2022/0020855 | A1* | 1/2022 | Liao | H10D 30/0415 |
| 2022/0028874 | A1 | 1/2022 | Lee et al. | |
| 2022/0231048 | A1* | 7/2022 | Sharangpani | H10B 41/10 |
| 2022/0254795 | A1* | 8/2022 | Popovici | H10B 51/30 |
| 2023/0051017 | A1* | 2/2023 | Gluschenkov | H10N 70/8833 |
| 2024/0172451 | A1* | 5/2024 | Schenk | H10D 1/694 |

OTHER PUBLICATIONS

Hsain, et al, Many routes to ferroelectric HfO2: A review of current deposition methods. J. Vac. Sci. Technol. A Jan. 1, 2022; 40 (1): 010803. https://doi.org/10.1116/6.000131 (Year: 2022).*
Shinji Migita et al 2019 Jpn. J. Appl. Phys. 58 SBBA07 DOI 10.7567/1347-4065/ab00f6 (Year: 2019).*
Yuki Hara et al 2021 Jpn. J. Appl. Phys. 60 SFFB05, doi: 10.35848/1347-4065/ac1250 (Year: 2021).*
Sales et al., Thermal stability of hafnium zirconium oxide on transition metal dichalcogenides, Applied Surface Science, vol. 546, 2021, 149058, ISSN 0169-4332, https://doi.org/10.1016/j.apsusc.2021.149058 (Year: 2021).*
Translation of CN 112635670 A (Year: 2021).*
Zhao, X., Vanderbilt, D. First-principles Study of Electronic and Dielectric Properties of ZrO2 and HfO2. MRS Online Proceedings Library 745, 7252 (2002). https://doi.org/10.1557/PROC-745-N7.2/T5.2.
M. H. Park, “A comprehensive study on the structural evolution of HfO2 thin films doped with various dopants” Journal of Materials Chemistry C, issue 19, 2017, published on Royal Society of Chemistry.
R. Materlik, “The Origin of Ferroelectricity in HfxZr1-xO2: A Computational Investigation and a Surface Energy Model” Journal of Applied Physics 117, 134109 (2015).

* cited by examiner 402
404

FERROELECTRIC DEVICES AND METHODS OF FORMING THE SAME

CROSS-REFERENCE TO RELATED APPLICATIONS

This application claims priority to U.S. Provisional Application No. 63/319,842, filed on Mar. 15, 2022, the contents of which are hereby incorporated by reference in their entirety.

BACKGROUND

Many modern-day electronic devices contain electronic memory configured to store data. Electronic memory may be volatile memory or non-volatile memory. Volatile memory stores data while it is powered, while non-volatile memory is able to store data when power is removed. Ferroelectric memory devices are one promising candidate for a next generation non-volatile memory technology. For example, ferroelectric memory devices include capacitor based ferroelectric random-access memory (FeRAM) and ferroelectric field effect transistor (FeFET). FeRAM and FeFET devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A and 6B are cross-sectional side views of a capacitor, in accordance with some embodiments.

DETAILED DESCRIPTION

Figure 1B:
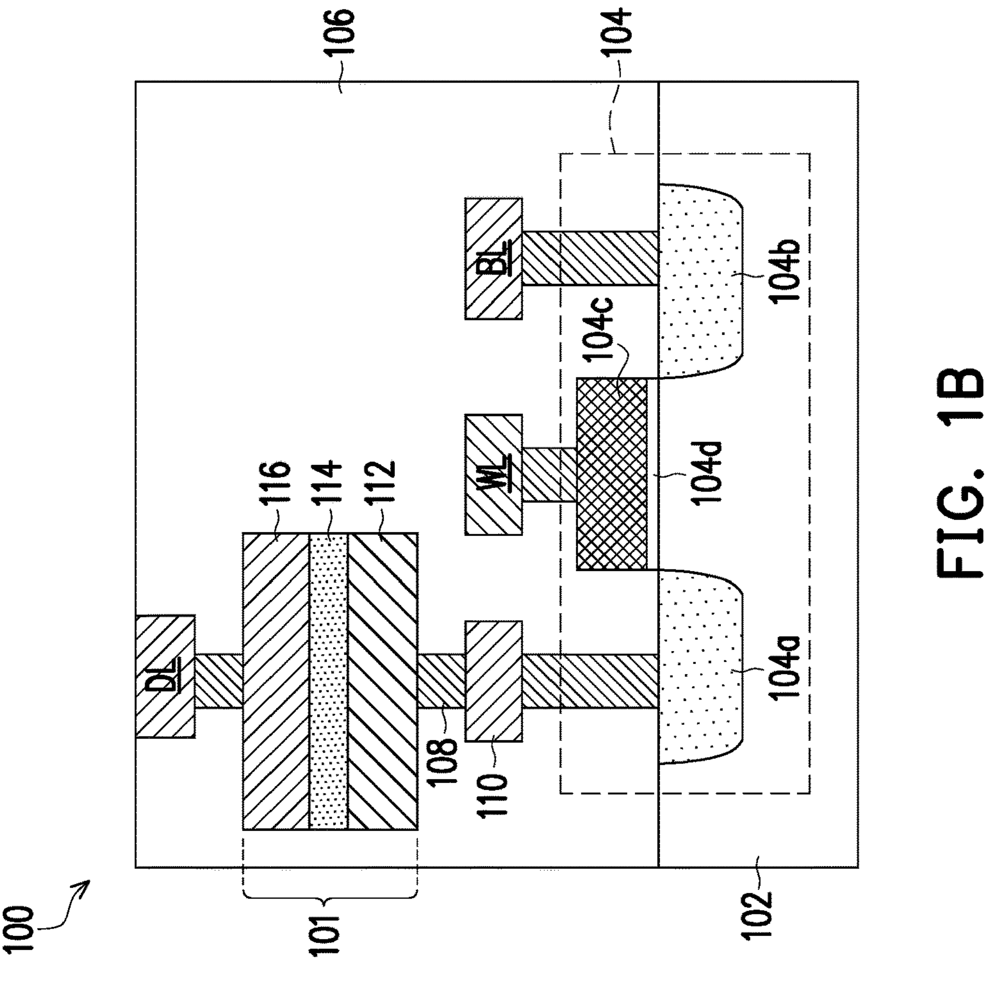
FIG. 1B is a cross-sectional side view of the FeRAM cell of FIG. 1A, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “over,” “on,” “top,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with “about,” “approximate,” and the like, the term is intended to encompass numbers that are within a reasonable range including the number described, such as within +/−10% of the number described or other values as understood by person skilled in the art. For example, the term “about 5 nm” encompasses the dimension range from 4.5 nm to 5.5 nm.

Some variation of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

Figure 1A:
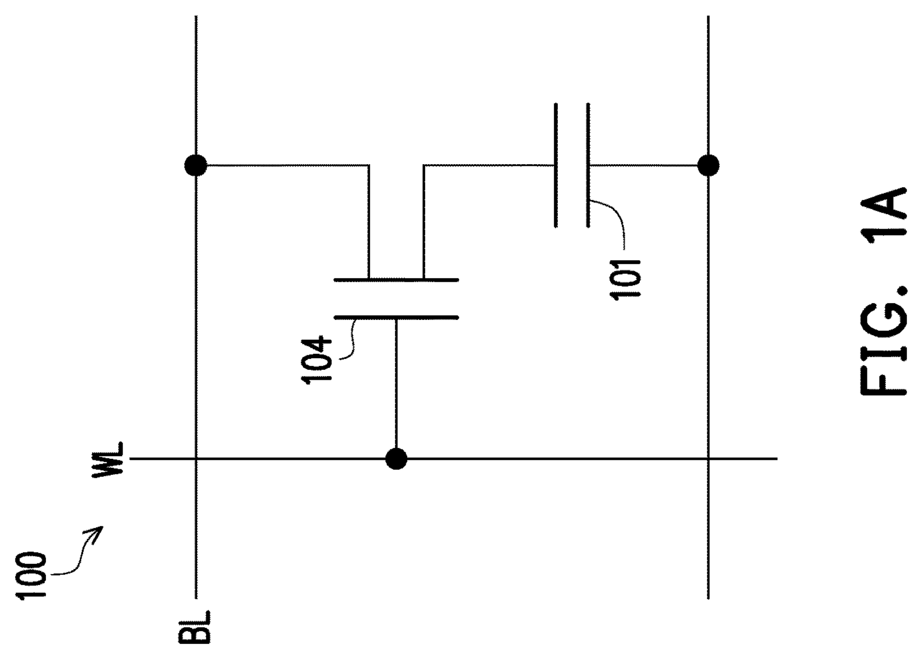
FIG. 1A is a circuit diagram of a FeRAM cell, in accordance with some embodiments.

FIG. 1A is a circuit diagram of a FeRAM cell 100, in accordance with some embodiments. As shown in FIG. 1A, the FeRAM cell 100 includes a transistor 104 and a capacitor 101. The FeRAM cell 100 shown in FIG. 1A is a one-transistor-one-capacitor (1T1C) type FeRAM cell. The FeRAM cell 100 may be other type of FeRAM cell, such as two-transistor-two-capacitor (2T2C) FeRAM cell. FIG. 1B is a cross-sectional side view of the FeRAM cell 100 of FIG. 1A, in accordance with some embodiments. As shown in FIG. 1B, the FeRAM cell 100 includes the transistor 104 disposed over a substrate 102. The transistor 104 includes a drain region **104*a* and a source region 104*b* disposed in the substrate 102. The substrate 102 may be a semiconductor substrate, such as a silicon wafer. For example, the substrate 102 can include silicon or a compound semiconductor, such as gallium arsenide (GaAs), indium phosphide (InP), silicon germanium (SiGe), silicon carbide (SiC), other suitable semiconductor materials, and/or combinations thereof. The substrate 102 may be doped with a dopant, such as an n-type dopant or a p-type dopant. The drain region 104***a* and the source region 104*b* may be doped with a dopant, such as an n-type dopant or a p-type dopant.

A gate electrode 104*c* is disposed over the substrate 102 between the drain region 104*a* and the source region 104*b*. The gate electrode 104*c* may include one or more layers. For example, the gate electrode 104*c* may include one or more work function layers and a bulk layer. In some embodiments, the work function layer includes one or more layers of electrically conductive material, such as a single layer of TiN, TaN, TaAlC, TiC, TaC, Co, Al, TiAl, HfTi, TiSi, TaSi or TiAlC, or a multilayer of two or more of these materials. The bulk layer may include an electrically conductive material, such as a metal. In some embodiments, the bulk layer includes W, Cu, Ti, Al, or Co. The gate electrode 104*c* may include additional layers, such as glue layer, barrier layer, capping layer, or any suitable layer. The work function layer and the additional layers may be optional. A gate dielectric layer 104*d* is disposed between the gate electrode 104*c* and the substrate 102. The gate dielectric layer 104*d* includes a dielectric material. In some embodiments, the gate dielectric layer 104*d* includes a high-k dielectric material, and in these embodiments, the gate dielectric layer 104*d* may have a k value greater than about 7.0 and may include a metal oxide or a silicate of hafnium, aluminum, zirconium, lanthanum, manganese, barium, titanium, lead, and combinations thereof.

The transistor 104 may be any suitable transistor, such as a planar transistor, a FinFET, or a nanostructure transistor, such as a gate-all-around (GAA) FET, a nanosheet FET, or a nanowire FET.

As shown in FIG. 1B, the gate electrode 104*c* may be electrically connected to the word line (WL), the source region 104*b* is electrically connected to the bit line (BL), the drain region 104*a* is electrically connected to the capacitor 101, and the capacitor 101 is electrically connected to the drive line (DL), in some embodiments. The drain region 104*a* may be electrically connected to the capacitor 101 via one or more conductive lines 110 and one or more conductive vias 108. The capacitor 101, the one or more conductive lines 110, and the one or more conductive vias 108 may be embedded in a dielectric structure 106. The dielectric structure 106 and the features formed therein may be an interconnect structure, and the dielectric structure 106 includes a plurality of intermetal dielectric (IMD) layers.

The capacitor 101 may be a ferroelectric capacitor (FeCAP). In some embodiments, the capacitor 101 includes a first electrode 112, a second electrode 116, and a ferroelectric layer 114 disposed between the first electrode 112 and the second electrode 116. In some embodiments, the ferroelectric layer 114 may be a high-k dielectric layer having dielectric constant greater than about 3.9. For example, the ferroelectric layer 114 may include a high-k dielectric such as a hafnium-based oxide material, such as hafnium dioxide ($HfO_2$). Other suitable ferroelectric dielectric material can be used. In some embodiments, the ferroelectric layer 114 can be a hafnium-based layer doped with any suitable elements, such as, for example, zirconium, aluminum, lanthanum, titanium, tantalum, silicon, yttrium, scandium, gadolinium, any other suitable element, or combinations thereof.

In some embodiments, the ferroelectric layer 114 is a doped hafnium dioxide layer having orthorhombic crystal phase. Other crystal phases, such as monoclinic or tetragonal phases, of the doped hafnium dioxide layer may not exhibit ferroelectric properties. The doped hafnium dioxide layer having orthorhombic crystal phase includes oxygen atoms that can move to two different positions with an applied electric field, so the doped hafnium dioxide layer having orthorhombic crystal phase has two orthorhombic geometries. The two orthorhombic geometries have an interconversion barrier, which can be switched by applying an electric field thereto. In some embodiments, addition of dopant atoms in the lattice of the hafnium oxide layer changes the local stress and may provide the oxygen atoms with sufficient space to move, resulting in ferroelectric behavior. Larger dopants shift the planes of monoclinic structure, so that the atoms tend to be arranged according to the orthorhombic structure. In some embodiments, the doped hafnium dioxide layer includes zirconium dopant having a dopant concentration between about 40 mole percent to about 60 mole percent. For example, the ferroelectric layer 114 may be from $Hf_{0.6}Zr_{0.4}O_2$ to $Hf_{0.4}Zr_{0.6}O_2$. In some embodiments, the zirconium dopant concentration is outside of the 40 mole percent to 60 mole percent range. For other dopants (D), such as aluminum, lanthanum, titanium, tantalum, silicon, yttrium, scandium, or gadolinium, the dopant concentration may range from about 0.1 mole percent to about 15 mole percent. For example, the ferroelectric layer 114 may be from $D_{0.01}Hf_{0.99}O_2$ to $D_{0.15}Hf_{0.5}O_2$. Zirconium as a dopant can have a relatively higher dopant concentration because zirconium and hafnium have similar electronic structure, and the oxides of zirconium and hafnium may be substantially the same. In some embodiments, crystallization in the orthorhombic crystal phase generates a mixture of the two states. The orthorhombic phases are then polarized in one of the two states by application of an electric voltage.

In some embodiments, doped hafnium dioxide layer as deposited is in an amorphous or partial crystalline state, and an anneal process is performed to increase the percentage of orthorhombic phase. Doped hafnium dioxide layer is multiphasic, which means it crystallizes in all available phases (monoclinic, orthorhombic, cubic, tetragonal). The greater percentage of orthorhombic phase in the ferroelectric layer 114, the better the ferroelectric properties. Ferroelectric properties of the doped hafnium dioxide layer may also depend on dopant concentration (lattice distortion facilities element movement when electrical field is applied), oxygen vacancy concentration (oxygen vacancy can help in creating the space in the lattice for the elements to move when electric field is applied), and fine balance between dopant and oxygen concentration.

Various embodiments of the present disclosure provide methods for forming doped hafnium dioxide layer having high percentage of orthorhombic crystal phase, such as greater than about 90 percent, for example greater than about 98 percent, or about 100 percent. The methods are described in detail in FIGS. 4 to 8C.

The first electrode 112 includes an electrically conductive material, such as W, TaN, TiN, Ti, Ru, Pt, Ir, or other suitable electrically conductive material. The second electrode 116 includes an electrically conductive material. In some embodiments, the second electrode 116 includes the same material as the first electrode 112.

Figure 2B:
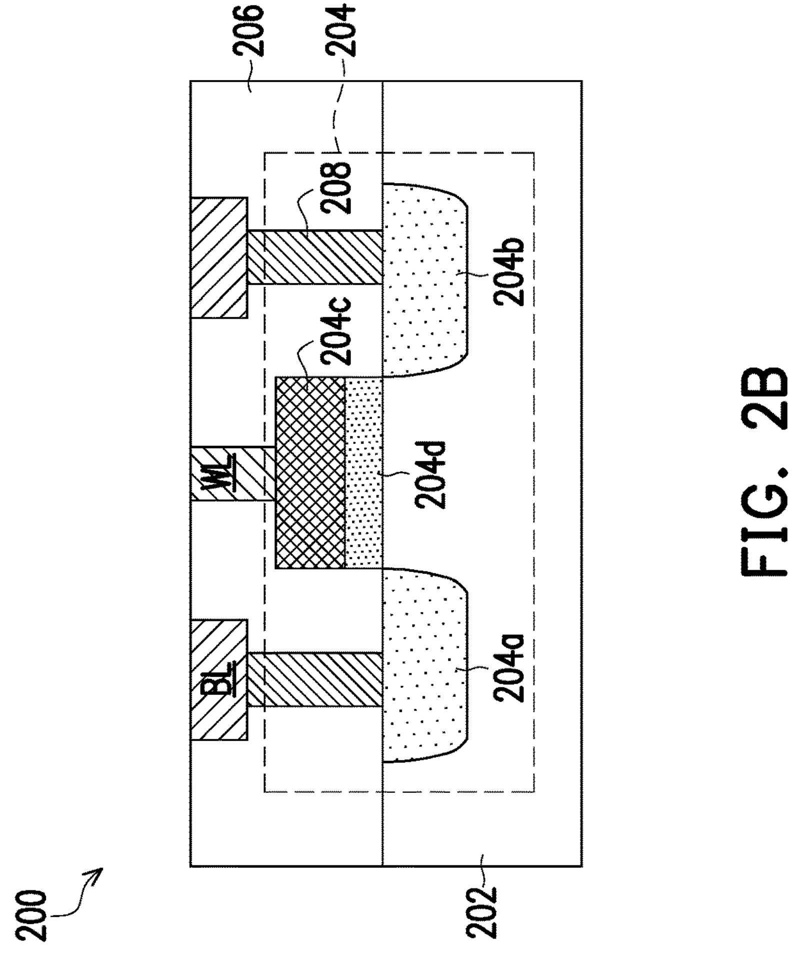
FIG. 2B is a cross-sectional side view of the FeFET cell of FIG. 2A, in accordance with some embodiments.
Figure 2A:
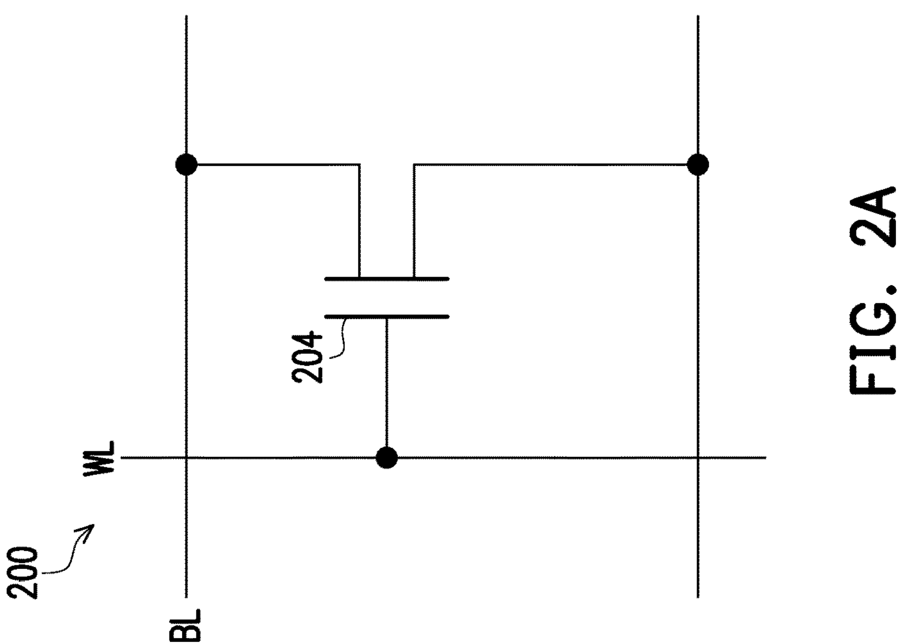
FIG. 2A is a circuit diagram of a FeFET cell, in accordance with some embodiments.

FIG. 2A is a circuit diagram of a FeFET cell 200, in accordance with some embodiments. FIG. 2B is a cross-sectional side view of the FeFET cell 200 of FIG. 2A, in accordance with some embodiments. As shown in FIGS. 2A and 2B, the FeFET cell 200 includes a FeFET 204 disposed over a substrate 202. The substrate 202 may include the same material as the substrate 102. The FeFET 204 includes a source region 204*a* and a drain region 204*b*. The source region 204*a* and the drain region 204*b* may include the same material as the source region 104*b* and the drain region 104*a*, respectively. A gate electrode 204*c* is disposed over the substrate 202, and the gate electrode 204*c* may include the same material as the gate electrode 104*c*. A ferroelectric layer 204*d* is disposed between the gate electrode 204*c* and the substrate 202. In some embodiments, an interfacial layer (not shown) may be disposed between the ferroelectric layer 204*d* and the substrate 202. The ferroelectric layer 204*d* may include the same material as the ferroelectric layer 114. A dielectric structure 206 is disposed over the FeFET 204, and the WL and BL are disposed in the dielectric structure 206. In some embodiments, the WL is electrically connected to the gate electrode 204*c*, and the BL is electrically connected to the source region 204*a*.

In some embodiments, the ferroelectric layer 204*d* is a doped hafnium dioxide layer. Similar to the ferroelectric layer 114 shown in FIG. 1B, the methods described in FIGS. 4 to 8C increases the percentage of orthorhombic crystal phase of the ferroelectric layer 204*d*, which in turn improves the ferroelectric properties of the ferroelectric layer 204*d*.

Figures 3, 4:
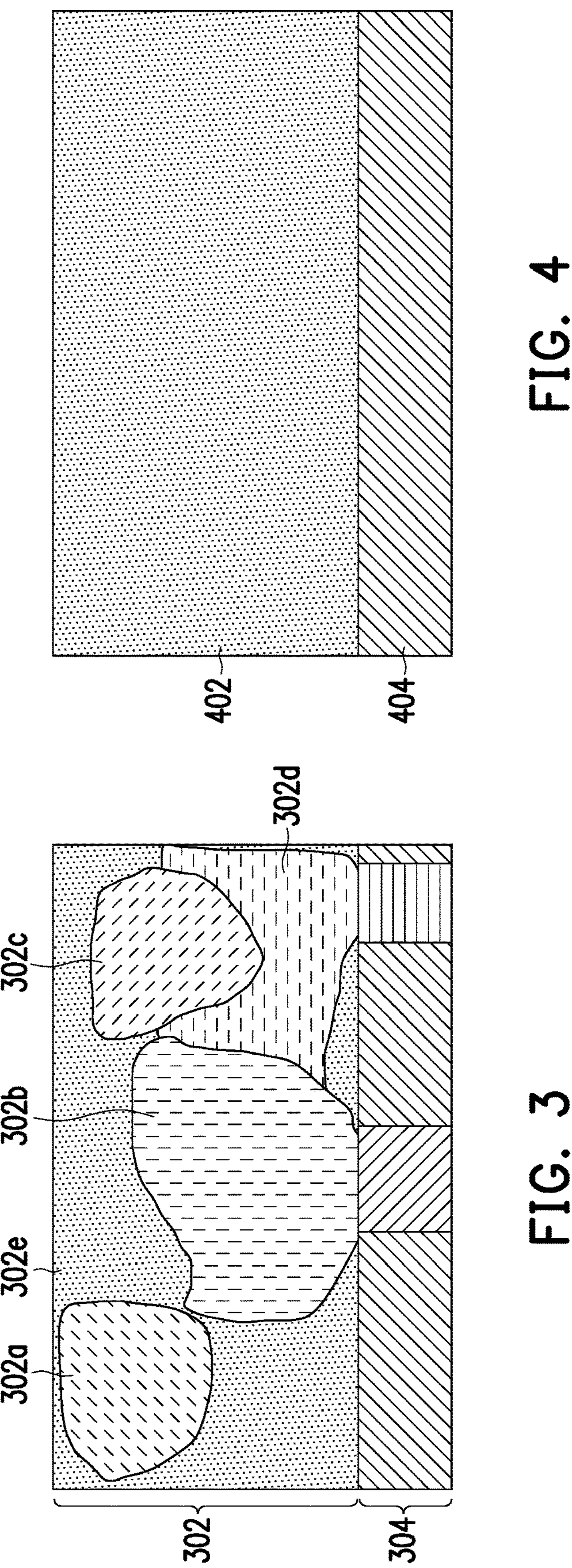
FIG. 3 is a cross-sectional side view of a ferroelectric layer formed on a polycrystalline metal layer, in accordance with some embodiments.
FIG. 4 is a cross-sectional side view of a ferroelectric layer formed on a monocrystalline metal layer, in accordance with some embodiments.

FIG. 3 is a cross-sectional side view of a ferroelectric layer 302 formed on a polycrystalline metal layer 304, in accordance with some embodiments. As shown in FIG. 3, the polycrystalline metal layer 304 includes two or more crystal phases 304*a*, 304*b*, 304*c*, and the ferroelectric layer 302 formed on the polycrystalline metal layer 304 is also polycrystalline. The ferroelectric layer 302 may include two or more crystal phases 302*a*, 302*b*, 302*c*, 302*d*, 302*e*. An anneal process is performed on the ferroelectric layer 302 in order to increase the percentage of orthorhombic phase. The ferroelectric layer 302 formed on a polycrystalline metal layer, such as the polycrystalline metal layer 304, may have less than 90 percent, such as less than about 50 percent, for example about 20 percent, of orthorhombic phase after the anneal process.

FIG. 4 is a cross-sectional side view of a ferroelectric layer 402 formed on a monocrystalline metal layer 404, in accordance with some embodiments. As shown in FIG. 4, the monocrystalline metal layer 404 includes a single crystal phase and the ferroelectric layer 402 formed on the monocrystalline metal layer 404 also includes a single crystal phase. In some embodiments, the ferroelectric layer 402 is a doped hafnium dioxide layer, and the lattice constants (or lattice parameters) a and b of the monocrystalline metal layer 404 are substantially the same as the lattice constants a and b of the doped hafnium dioxide layer in orthorhombic phase. The monocrystalline metal layer 404 may function as a seed layer for the ferroelectric layer 402 to crystalize thereon. If the lattice constants a and b of the monocrystalline metal layer 404 are substantially the same as those of the orthorhombic doped hafnium dioxide layer, the ferroelectric layer 402 formed on the monocrystalline metal layer 404 will try to match the orthorhombic crystal phase. The lattice constant c of the monocrystalline metal layer 404 has little influence on the crystallization of the ferroelectric layer 402, because the lattice constant c relates to a dimension out of the plane acting as seed. The interface property of the monocrystalline metal layer 404 is more important than the thickness of the monocrystalline metal layer 404.

In some embodiments, the monocrystalline metal layer 404 has a symmetric crystal structure, and an angle between the lattice constants a and b is about 90 degrees. For example, the crystal structure of the monocrystalline metal layer 404 may be cubic, tetragonal, orthorhombic, or other suitable crystal structure. In some embodiments, the crystal structure of the monocrystalline metal layer 404 may be any suitable cubic structure, such as simple cubic, body centered, face centered, or other suitable structure. The ferroelectric layer 402 deposited on the monocrystalline metal layer 404 will try to match the cubic-like hafnium dioxide lattice cell with the one from the monocrystalline metal layer 404. It does not have to be an exact match, as long as the lattice cell is closer to orthorhombic hafnium dioxide than monoclinic hafnium dioxide. A certain mismatch (e.g., up to about 10 percent, such as from about 5 percent to about 10 percent) between the lattice constants a and b of the monocrystalline metal layer 404 and the lattice constants a and b of the ferroelectric layer 402 may be tolerated. For example, if the lattice constants a and b of the monocrystalline metal layer 404 are smaller, the lattice constant c of the ferroelectric layer 402 will tend to be larger; if the lattice constants a and b of monocrystalline metal layer 404 are larger, the lattice constant c of the ferroelectric layer 402 will be smaller; the cells of the ferroelectric layer 402 tend to retain their volume. In both cases, the ferroelectric layer 402 will tend to crystallize with lattice constants a and b matching the lattice constants a and b of the monocrystalline metal layer 404. For mismatch greater than about 10 percent, beyond a certain physical thickness of the ferroelectric layer 402 (e.g., about 10 nm), the lattice will relax, so the layer can may be thin, such as less than about 10 nm.

In some embodiments, the monocrystalline metal layer 404 is a NiAl layer. The NiAl layer may have cubic crystal structure and may be formed by any suitable method, such as physical vapor deposition (PVD). The nickel concentration of the NiAl may range from about 40 atomic percent to about 60 atomic percent, such as from about 40 atomic percent to about 45 atomic percent. The nickel content may affect the size of the NiAl crystal and the degree of crystallinity. Lower nickel amount, such as from about 40 atomic percent to about 45 atomic percent, may lead to better matching of the orthorhombic structure. For example, in X-ray diffraction analysis (XRD), a peak appears around 31 to 32 degrees, which is close to orthorhombic peak of hafnium dioxide. At lower nickel concentration, such as less than 45 atomic percent, the peak is stronger. NiAl is cubic with lattice constants a and b being equal, such as between about 0.286 nm and about 0.289 nm.

Figure 5:
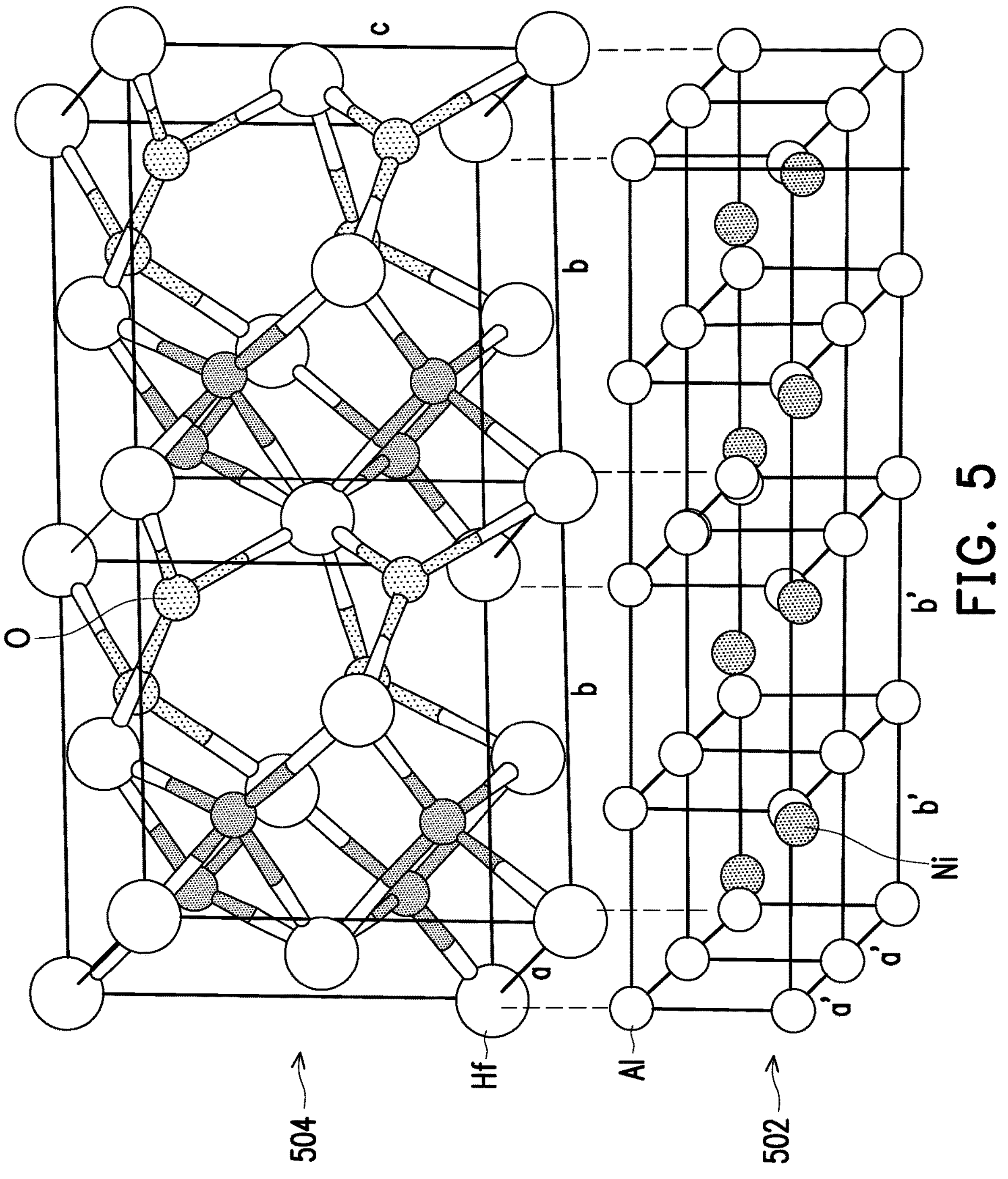
FIG. 5 illustrates crystal structures of the monocrystalline metal layer and the ferroelectric layer of FIG. 4, in accordance with some embodiments.

In some embodiments, the lattice constants a and b of the ferroelectric layer 402 may be multiple of the lattice constants of the monocrystalline metal layer 404, respectively. FIG. 5 illustrates crystal structures of the monocrystalline metal layer and the ferroelectric layer of FIG. 4, in accordance with some embodiments. As shown in FIG. 5, the monocrystalline metal layer 404 may be a NiAl layer having the crystal structure 502, and the ferroelectric layer 402 may be a doped hafnium dioxide layer having the crystal structure 504. The lattice constant a of the ferroelectric layer 402 may be a multiple of the lattice constant a' of the monocrystalline metal layer 404. For example, the lattice constants a' and b' of NiAl are both about 0.286 nm, and the lattice constants a and b of the ferroelectric layer 402 may be about 0.572 nm, which is about twice lattice constants a' and b'.

With the lattice constants a and b being about 0.572 nm, the crystal structure of the ferroelectric layer 402 is substantially orthorhombic.

Referring back to FIG. 4, the ferroelectric layer 402 may be formed by any suitable method, such as atomic layer deposition, PVD, or chemical vapor deposition (CVD). In some embodiments, the ferroelectric layer 402 are formed on the monocrystalline metal layer 404 by ALD. In some embodiments, the ferroelectric layer 402 has a thickness ranging from about 3 nm to about 20 nm, such as from about 5 nm to about 20 nm. In some embodiments, the ferroelectric layer 402 has a thickness greater than about 20 nm or is formed by a process with a processing temperature less than about 350 degrees Celsius, such as from about 250 degrees Celsius to about 300 degrees Celsius, and an optional anneal process may be performed to increase the percentage of orthorhombic phase. For example, the anneal process may include heating the ferroelectric layer 402 to a temperature ranging from about 200 degrees Celsius to about 600 degrees Celsius in any suitable environment, such as oxygen gas, nitrogen gas, or hydrogen gas for a time duration of 1 second to about 300 seconds. In some embodiments, the process to form the ferroelectric layer 402 may be performed at elevated temperature, such as from about 200 degrees Celsius to about 600 degrees Celsius.

The ferroelectric layer 402 shown in FIG. 4 may have an increased orthorhombic phase, such as over 90 percent orthorhombic phase, for example over 98 percent orthorhombic phase. In addition, out of the 90 percent orthorhombic phase, 80 percent of the orthorhombic phase of the ferroelectric layer 402 may be horizontally aligned, which contributes to ferroelectricity. Furthermore, the ferroelectric layer 402 includes crystal domains ranging from about 5 nm to about 20 nm, such as from about 10 nm to about 20 nm.

Figures 6A, 6B:
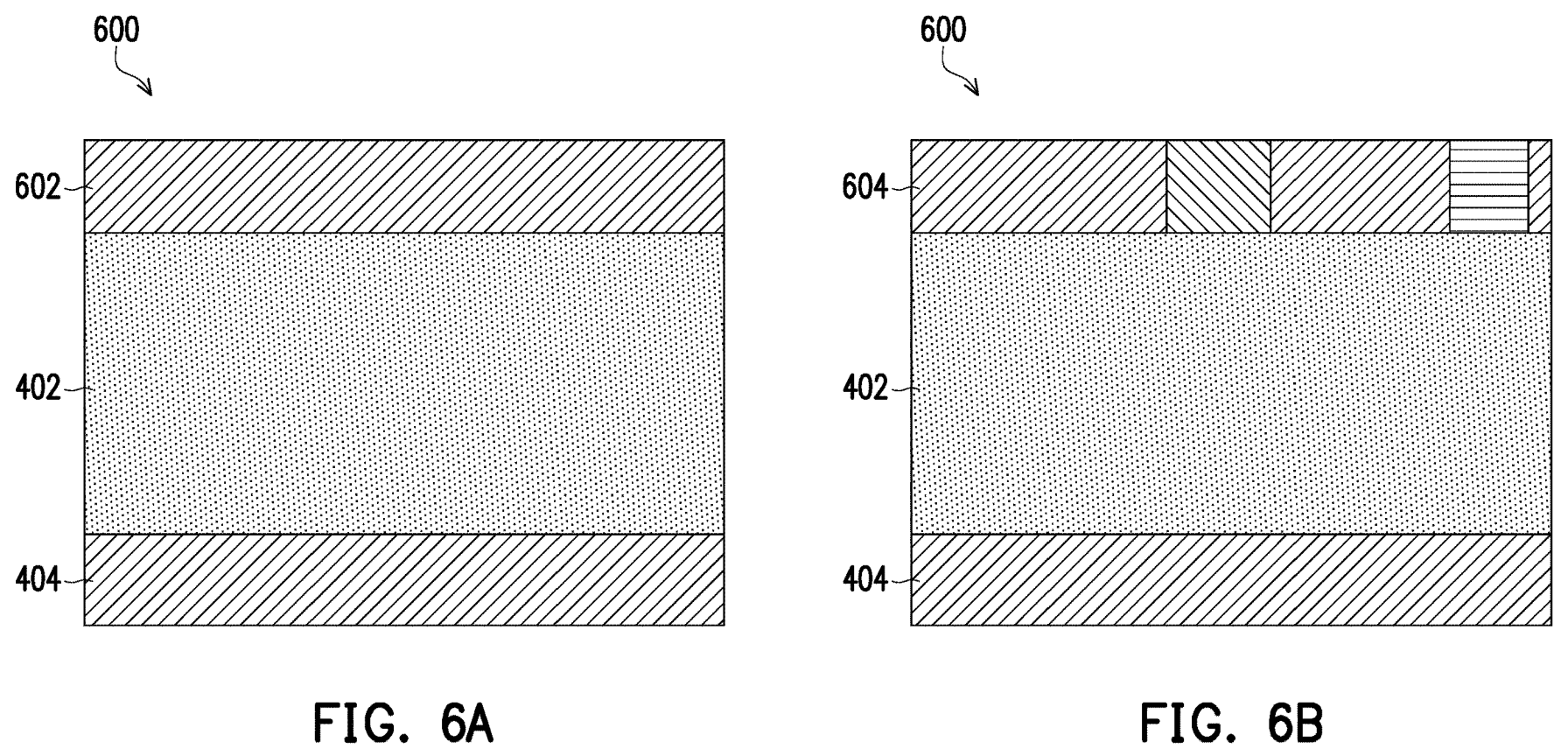

FIGS. 6A and 6B are cross-sectional side views of a capacitor 600, in accordance with some embodiments. In some embodiments, as shown in FIG. 6A, the capacitor 600 includes the monocrystalline metal layer 404 as a first electrode, a metal layer 602 as the second electrode, and the ferroelectric layer 402 is disposed between the monocrystalline metal layer 404 and the metal layer 602. In some embodiments, the metal layer 602 is a monocrystalline metal layer. The metal of the metal layer 602 may or may not be the same as the metal of the monocrystalline metal layer 404.

In some embodiments, as shown in FIG. 6B, the capacitor 600 includes the monocrystalline metal layer 404 as a first electrode, a metal layer 604 as the second electrode, and the ferroelectric layer 402 is disposed between the monocrystalline metal layer 404 and the metal layer 604. In some embodiments, the metal layer 604 is a polycrystalline metal layer. The metal of the metal layer 604 may or may not be the same as the metal of the monocrystalline metal layer 404. The metal layer 602 or the metal layer 604 does not affect the crystal structure of the ferroelectric layer 402. In some embodiments, the optional anneal process is performed after the formation of the metal layer 602 or the metal layer 604. The capacitor 600 shown in FIGS. 6A and 6B may be utilized as the capacitor 101 shown in FIGS. 1A and 1B.

Figure 7C:
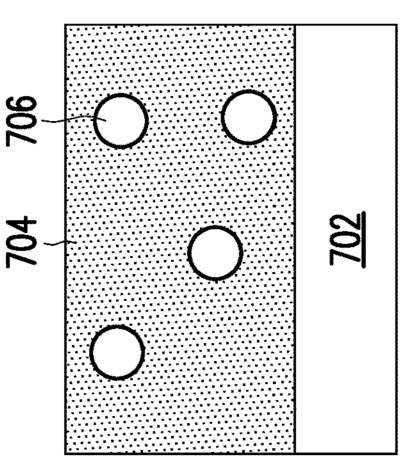
FIGS. 7A-7C illustrates various stages of forming a ferroelectric layer, in accordance with some embodiments.
Figure 7B:
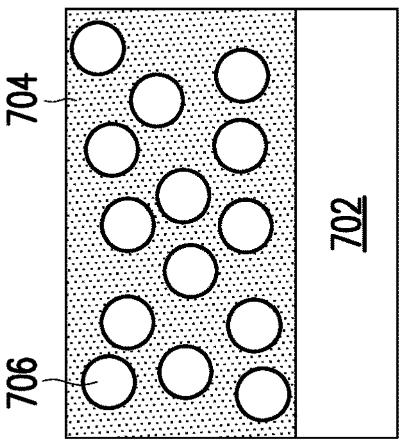
Figure 7A:
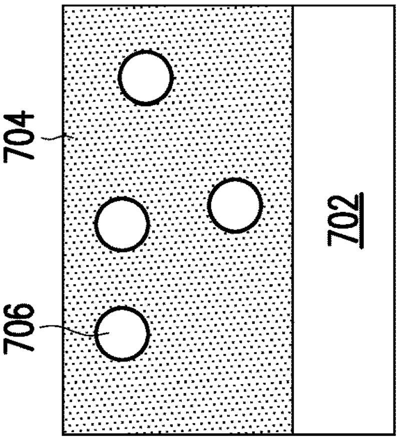

FIGS. 7A to 7C illustrates various stages of forming a ferroelectric layer 704, in accordance with some embodiments. As shown in FIG. 7A, the ferroelectric layer 704 is deposited on a layer 702. The layer 702 may be a metal layer, such as the first electrode 112 shown in FIG. 1B, or a semiconductor layer, such as the substrate 202 shown in FIG. 2B. In some embodiments, the layer 702 is the monocrystalline metal layer 404 shown in FIG. 4. In some embodiments, the layer 702 is a dielectric layer, such as an interfacial layer. The ferroelectric layer 704 may be a doped hafnium dioxide layer and may be formed by any suitable method, such as CVD, ALD, or PVD. The ferroelectric layer 704 includes oxygen vacancies 706. The oxygen vacancies 706 of the as deposited ferroelectric layer 704 may range from about 2 percent to about 5 percent.

Next, as shown in FIG. 7B, an ultra-high vacuum (UHV) anneal process is performed on the ferroelectric layer 704 to crystallize the ferroelectric layer 704 and to increase the concentration of the oxygen vacancies 706. In some embodiments, the UHV anneal process is performed at a processing temperature ranging from about 20 degrees Celsius to about 450 degrees Celsius and a processing pressure less than $1e^{-3}$ Torr, such as from about $1e^{-8}$ Torr to about $1e^{-3}$ Torr. The UHV anneal process reduces the pressure outside of the ferroelectric layer 704, so the oxygen atoms in the ferroelectric layer 704 escapes from the ferroelectric layer 704. The resulting oxygen vacancies 706 concentration is increased to about 5 percent to about 10 percent. The removal of oxygen atoms, or the creation of additional oxygen vacancies, creates spaces for the atoms to move within the ferroelectric layer 704, and increased orthorhombic phase can be obtained under the above mentioned UHV anneal process conditions compared to the conventional anneal process. In some embodiments, the percent of orthorhombic phase is not increased, but the ferroelectricity is expected to be higher due to the remaining oxygen atoms in the ferroelectric layer 704 have more room to move as a result of the UHV anneal process.

After the UHV anneal process, the ferroelectric layer 704 is crystallized with a major crystal phase being orthorhombic phase. Next, as shown in FIG. 7C, an optional anneal process is performed on the ferroelectric layer 704 to reduce oxygen vacancies 706 to improve reliability. The anneal process may be performed in an oxygen gas environment at a processing temperature ranging from about 20 degrees Celsius to about 450 degrees Celsius and a processing pressure ranging from about 1 atm to about 20 atm for a time duration ranging from about 1 minute to about 5 hours. After crystallization from the UHV anneal process, the crystal phase of the ferroelectric layer 704 is substantially stable, so no phase change should be observed following the optional anneal process. After the optional anneal process, the concentration of the oxygen vacancies 706 is reduced to the level prior to the UHV anneal process, such as from about 2 percent to about 5 percent. With the lowered concentration of the oxygen vacancies 706, device reliability is improved.

The ferroelectric layer 704 formed by the UHV anneal process has improved ferroelectricity as a result of increased percentage of orthorhombic crystal phase and/or more space for the atoms in the ferroelectric layer 704 to move. The optional anneal process further improves device reliability. In some embodiments, the ferroelectric layer 704 may be utilized as the ferroelectric layer 114 in the capacitor 101, and the UHV process and the optional anneal process may be performed prior to the formation of the second electrode 116. In some embodiments, the layer 702 is the first electrode 112, and the ferroelectric layer 704 is the ferroelectric layer 114. In some embodiments, the ferroelectric layer 704 may be utilized as the ferroelectric layer **204*d* in the FeFET 204, and the UHV process and the optional anneal process may be performed prior to the formation of the gate electrode 204*c*. In some embodiments, the layer 702 is the substrate 202 (or the interfacial layer formed on the substrate 202), and the ferroelectric layer 704 is the ferroelectric layer 204***d*.

Figure 8C:
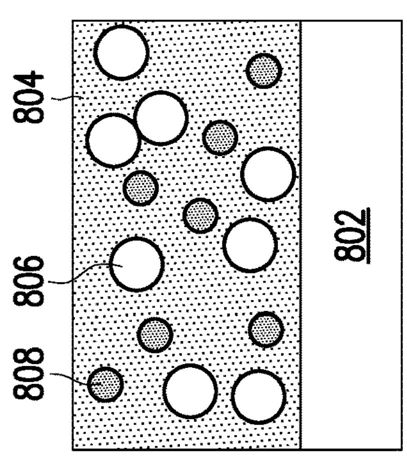
FIGS. 8A-8C illustrates various stages of forming a ferroelectric layer, in accordance with some embodiments.
Figure 8B:
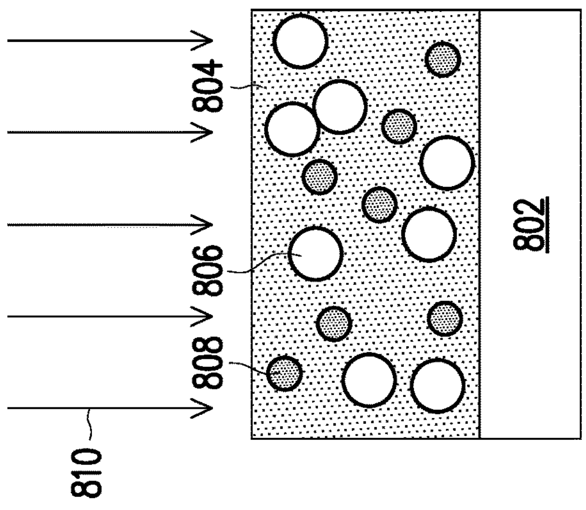
Figure 8A:
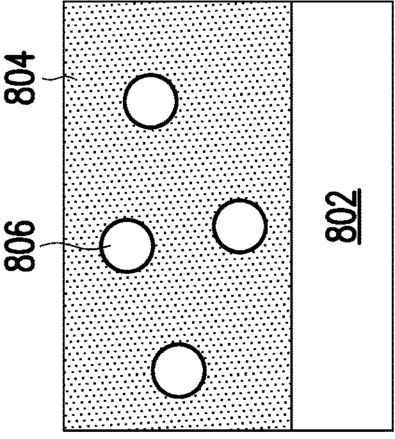

FIGS. 8A to 8C illustrates various stages of forming a ferroelectric layer 804, in accordance with some embodiments. As shown in FIG. 8A, the ferroelectric layer 804 is deposited on a layer 802. The layer 802 may include the same material as the layer 702. The ferroelectric layer 804 may be a doped hafnium dioxide layer and may be formed by any suitable method, such as CVD, ALD, or PVD. The ferroelectric layer 804 includes oxygen vacancies 806. The oxygen vacancies 806 of the as deposited ferroelectric layer 804 may range from about 2 percent to about 5 percent.

Next, as shown in FIG. 8B, an ion implantation process 810 is performed on the ferroelectric layer 804 to remove crystallinity from the as deposited ferroelectric layer 804 and to provide an amorphous phase in the ferroelectric layer 804. As described above, in some embodiments, the as deposited doped hafnium dioxide layer may be partially crystallized. The crystal phase of the as deposited doped hafnium dioxide layer may be mostly monoclinic, which does not exhibit ferroelectric properties. The ion implantation process 810 introduces a dopant 808, which may be different from the dopant of the doped hafnium dioxide layer, into the as deposited doped hafnium dioxide layer to displace the elements of the doped hafnium dioxide layer. As a result, the crystallinity of the as deposited doped hafnium dioxide layer is removed. In other words, the crystalline structures of the as deposited doped hafnium dioxide layer are destroyed by the dopant 808 from the ion implantation process 810, and the resulting doped hafnium dioxide layer is an amorphous layer.

The ion implantation process 810 may be performed with an ion energy ranging from about 1 keV to about 10 keV. If the ion energy is less than about 1 keV, the monoclinic crystal structures in the as deposited doped hafnium dioxide layer are not destroyed. On the other hand, if the ion energy is greater than about 10 keV, the manufacturing cost is increased without significant advantage. The dose of the ion implantation process may range from about $1e^{13}/cm^2$ to about leis/$cm^2$. The ion implantation process 810 may lead to shallow doping, such as about 10 nm or less. In some embodiments, the dopant 808 may be p-type or n-type dopants, such as phosphorous (P), arsenic (As), or boron (B). In some embodiments, the dopant 808 may be gallium (Ga), antimony (Sb), germanium (Ge), silicon (Si), or other suitable dopant. The as deposited doped hafnium dioxide layer already includes a dopant, such as zirconium, aluminum, lanthanum, titanium, tantalum, silicon, yttrium, scandium, gadolinium, which may be different from the dopant 808. In some embodiments, the ferroelectric layer 804 includes two different dopants. For example, the first dopant is formed in-situ during the deposition of the doped hafnium dioxide layer, and the second dopant is introduced into the doped hafnium dioxide layer by the ion implantation process performed after the deposition of the doped hafnium dioxide layer.

Next, as shown in FIG. 8C, an anneal process is performed on the ferroelectric layer 804 to form orthorhombic phase. The anneal process may be performed at a processing temperature ranging from about 20 degrees Celsius to about 550 degrees Celsius for a time duration ranging from about 1 second to about 1 hour. The anneal process changes the amorphous phase to crystalline phase, specifically orthorhombic crystalline phase. Without the ion implantation process to amorphize the monoclinic crystalline phase, the ferroelectric layer 804 may include both monoclinic and orthorhombic crystalline phases after the anneal process. Thus, by removing the monoclinic crystalline phase prior to performing the anneal process, the resulting ferroelectric layer 804 is crystalline and includes mostly orthorhombic phase.

In some embodiments, the ferroelectric layer 804 may be utilized as the ferroelectric layer 114 in the capacitor 101, the ion implantation process 810 may be performed prior to the formation of the second electrode 116, and the anneal process may be performed prior to or after the formation of the second electrode 116. In some embodiments, the layer 802 is the first electrode 112, and the ferroelectric layer 804 is the ferroelectric layer 114. In some embodiments, the ferroelectric layer 804 may be utilized as the ferroelectric layer 204*d* in the FeFET 204, the ion implantation process 810 may be performed prior to the formation of the gate electrode 204*c*, and the anneal process may be performed prior to or after the formation of the gate electrode 204*c*. In some embodiments, the layer 802 is the substrate 202 (or the interfacial layer formed on the substrate 202), and the ferroelectric layer 804 is the ferroelectric layer 204*d*.

Figure 9A:
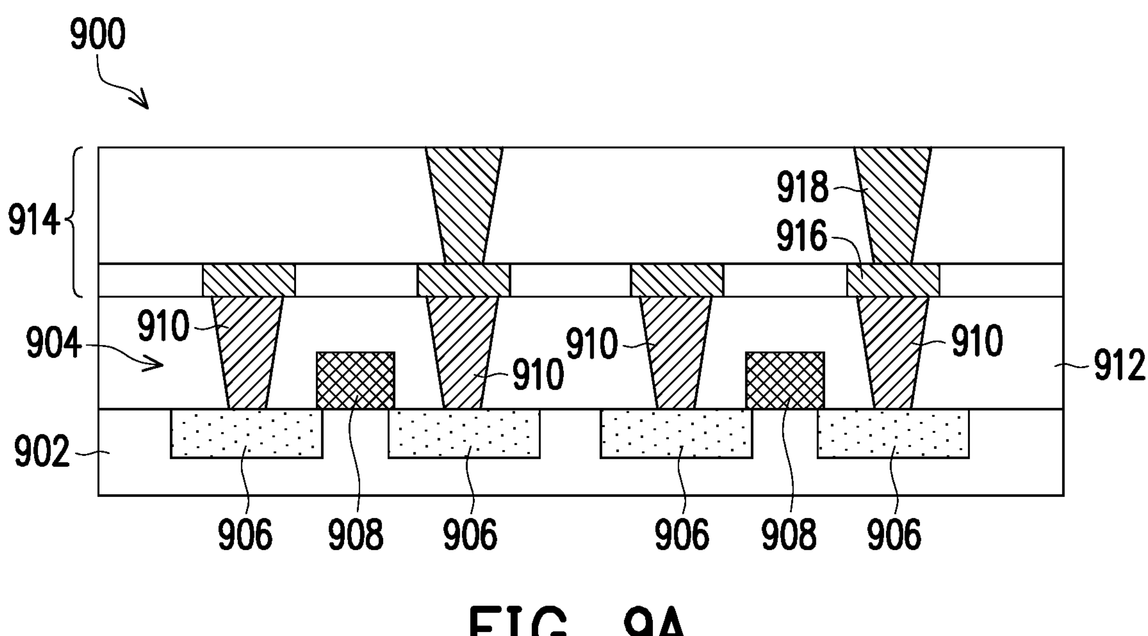
FIGS. 9A-9G are cross-sectional side views of various manufacturing stages of a semiconductor device structure, in accordance with some embodiments.

FIGS. 9A-9G are cross-sectional side views of various manufacturing stages of a semiconductor device structure 900, in accordance with some embodiments. As shown in FIG. 9A, the semiconductor device structure 900 includes a substrate 902 and one or more transistors 904 disposed on the substrate 902. The substrate 902 may be the substrate 102, and the transistors 904 may be the same transistor 104 shown in FIG. 1B. Each transistor 904 includes source/drain regions 906 and a gate electrode 908, which may be the same as the drain region 104*a*, the source region 104*b*, and the gate electrode 104*c*. Conductive contacts 910 are electrically connected to the source/drain regions 906. The conductive contacts 910 may be disposed in an interlayer dielectric (ILD) layer 912. An interconnect structure 914 is disposed over the transistors 904. The interconnect structure 914 may be the dielectric structure 106 shown in FIG. 1B. Conductive lines 916 and conductive vias 918 are formed in the interconnect structure 914. The conductive lines 916 and the conductive vias 918 may be the conductive lines 110 and conductive vias 108 shown in FIG. 1B, respectively.

Figure 9B:
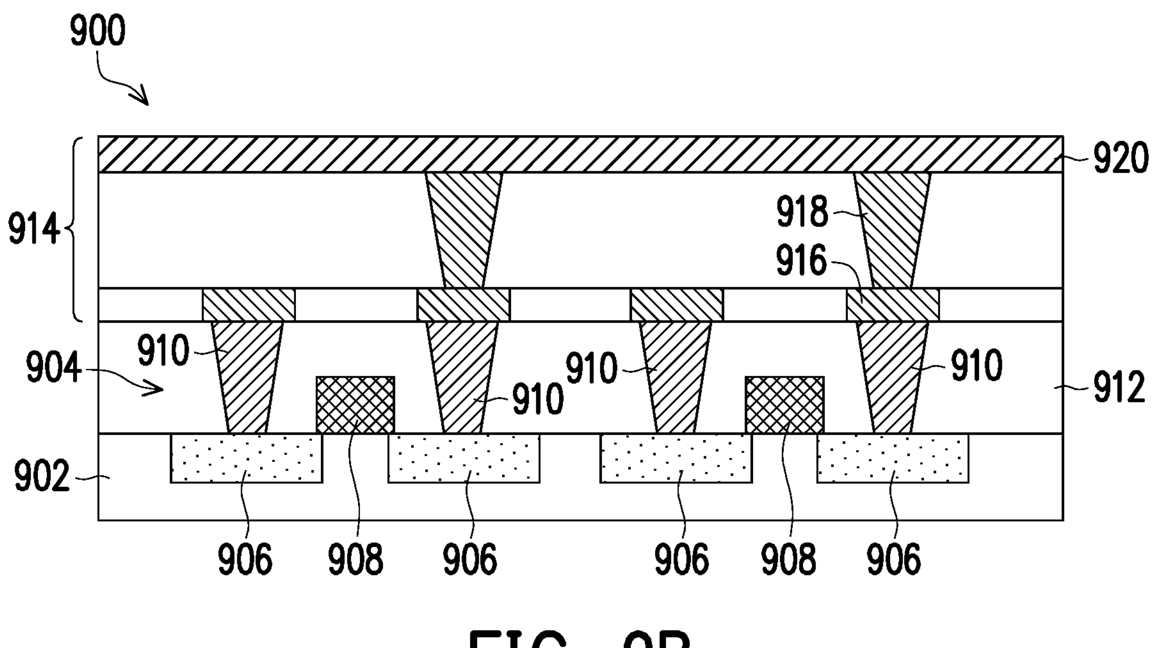
Figure 9C:
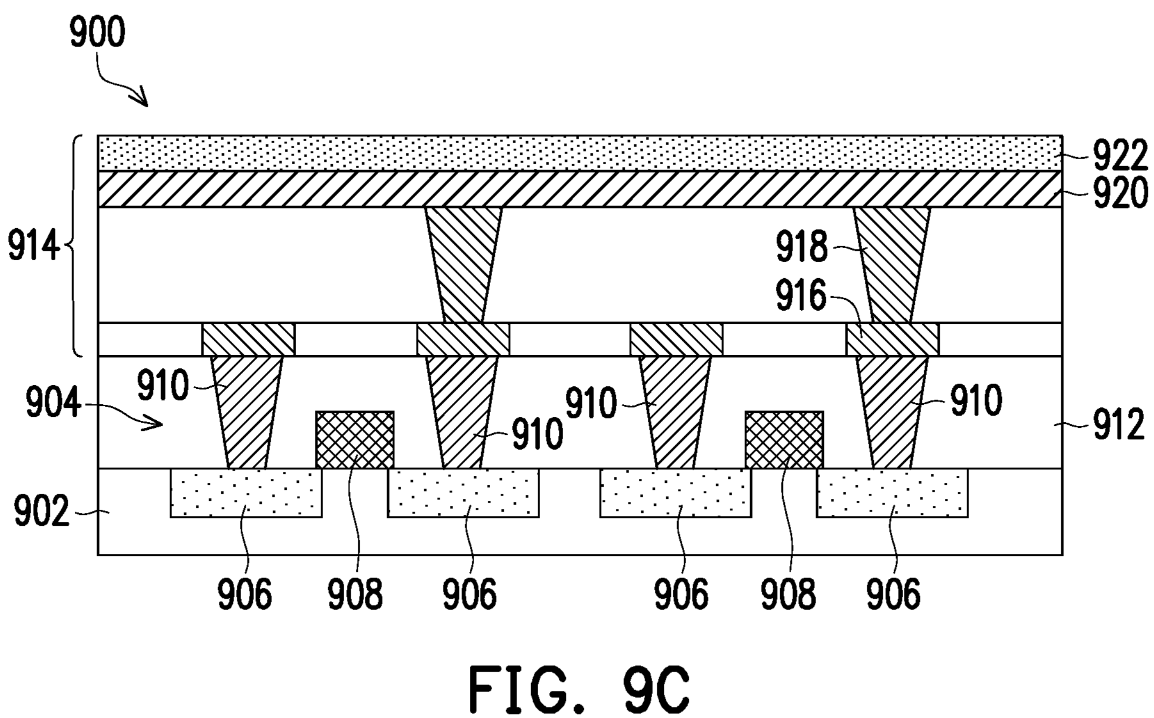
Figure 9D:
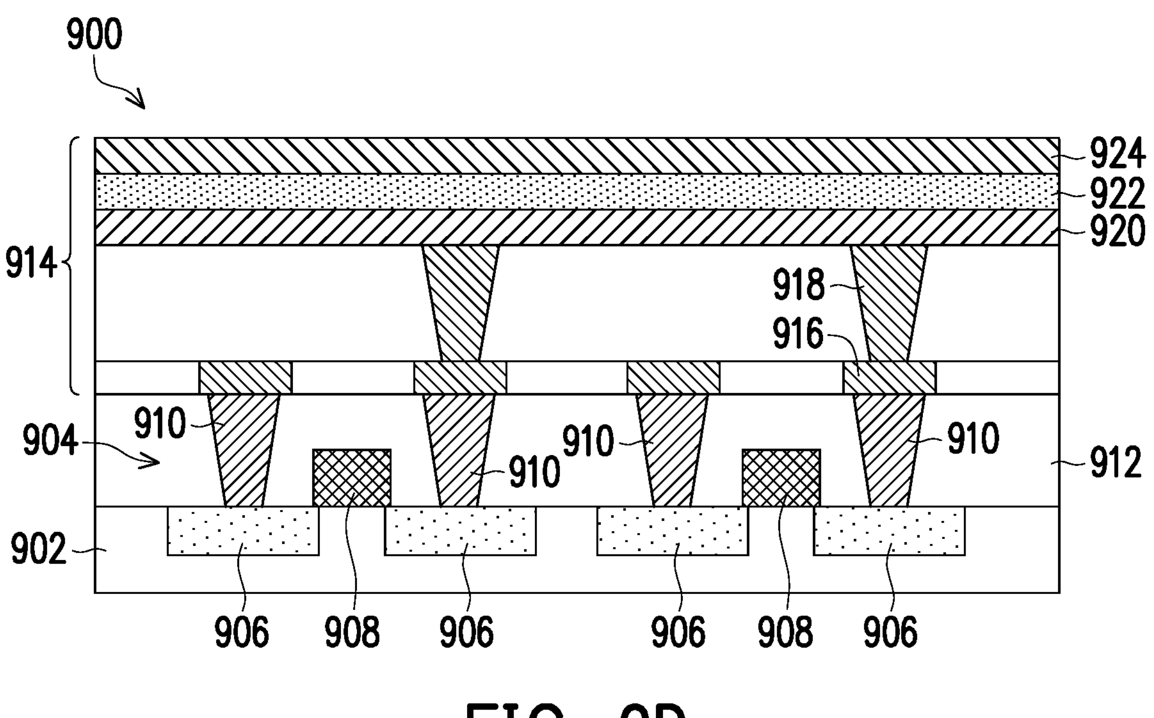

Next, as shown in FIG. 9B, a conductive layer 920 is formed on the conductive vias 918 that are electrically connected to one of the source/drain regions 906 of each transistor 904. The conductive layer 920 may include the same material as the first electrode 112 shown in FIG. 1B. In some embodiments, the conductive layer 920 is a monocrystalline metal layer such as the monocrystalline metal layer 404 shown in FIG. 4. Next, as shown in FIG. 9C, a ferroelectric layer 922 is formed on the conductive layer 920. The ferroelectric layer 922 may be the ferroelectric layer 402 shown in FIG. 4. In some embodiments, the ferroelectric layer 922 is the ferroelectric layer 704 shown in FIGS. 7A to 7C or the ferroelectric layer 804 shown in FIGS. 8A to 8C. Next, as shown in FIG. 9D, a conductive layer 924 is formed on the ferroelectric layer 922. The conductive layer 924 may include the same material as the second electrode 116 of FIG. 1B, the metal layer 602 of FIG. 6A, or the metal layer 604 of FIG. 6B.

Figure 9E:
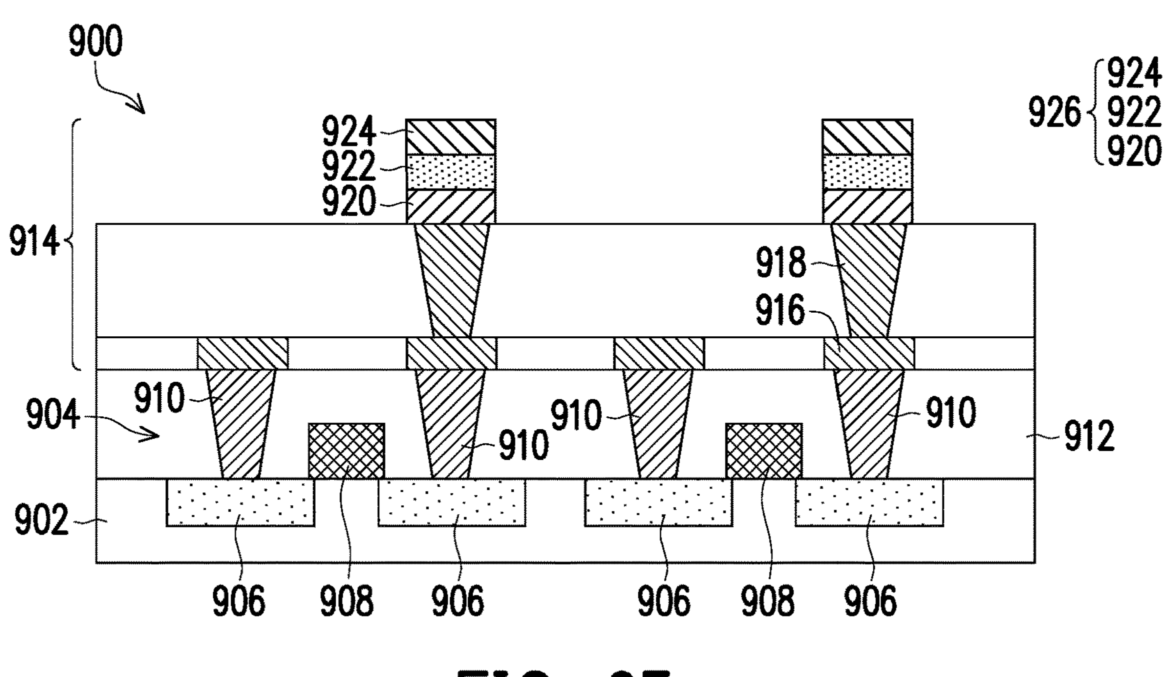
Figure 9F:
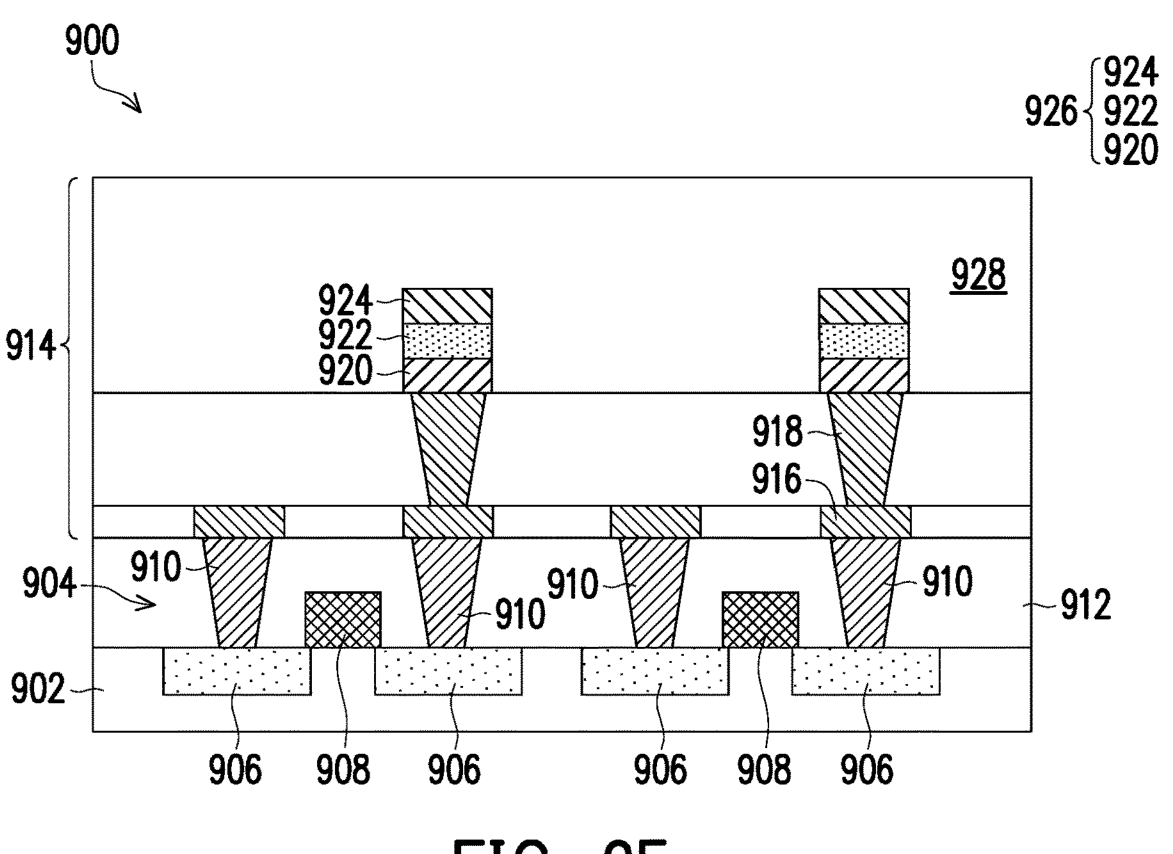
Figure 9G:
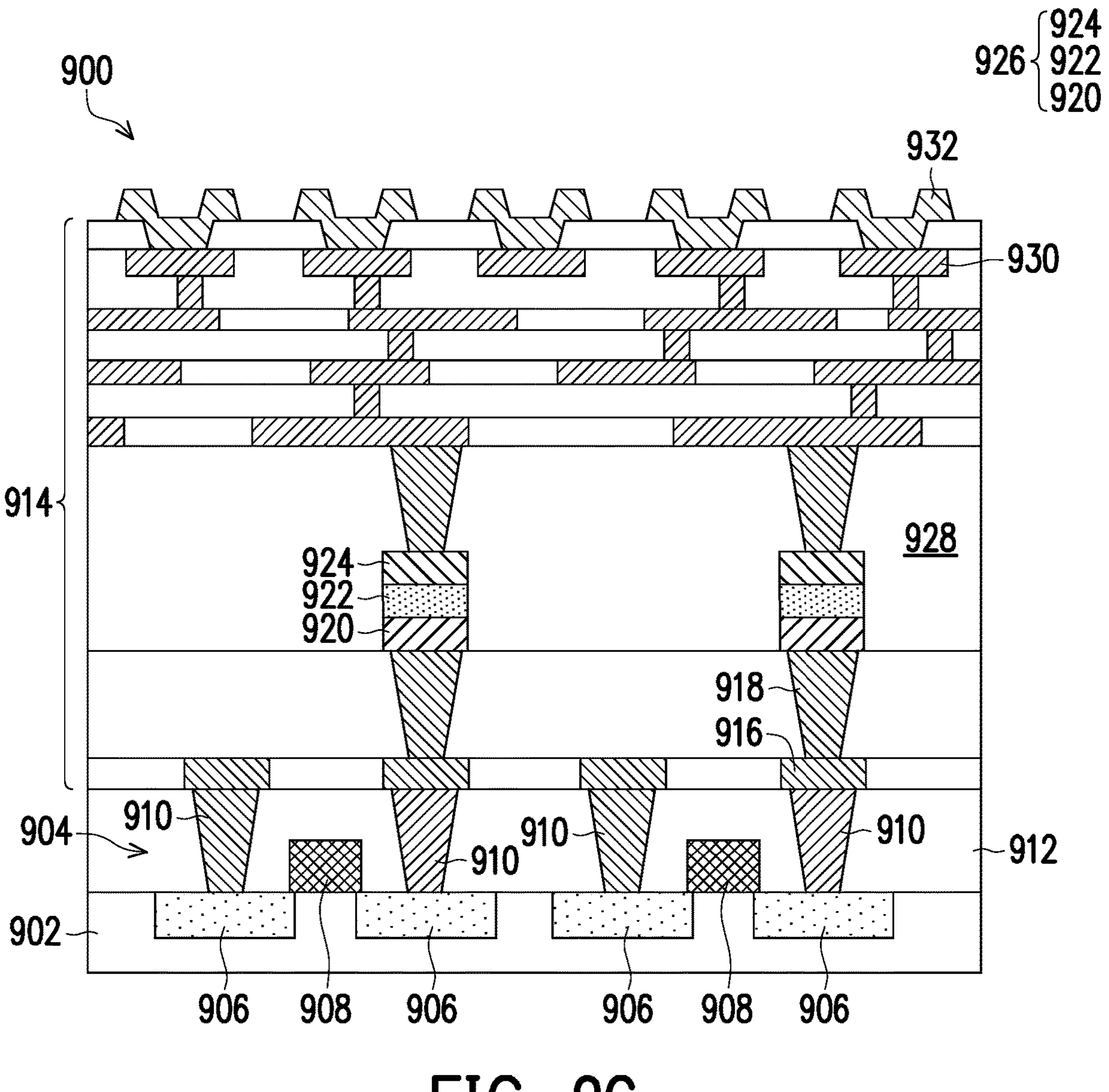

Next, as shown in FIG. 9E, the conductive layers 920, 924 and the ferroelectric layer 922 are patterned to form capacitors 926. The capacitor 926 may be a FeCAP having improved ferroelectric properties as a result of having the ferroelectric layer 922, which may be formed by the processes described in FIGS. 4 to 8C. Next, as shown in FIG. 9F, a dielectric layer 928 is formed to embed the capacitors 926. The dielectric layer 928 may be an IMD layer and is part of the interconnect structure 914. The capacitors 926 may be formed in the interconnect structure 914 in back-end-of-line (BEOL) processes. In some embodiments, the capacitors 926 are formed in front-end-of-line (FEOL) or middle-of-line (MOL) processes. Next, as shown in FIG. 9G, additional processes are performed to complete the interconnect structure 914. At the top of the interconnect structure 914, a plurality of redistribution layers (RDLs) 930 are formed, and contact pads 932 are formed on the RDLs. The semiconductor device structure 900 includes a plurality of FeRAM cells (a transistor 904 and a capacitor 926).

Figure 10:
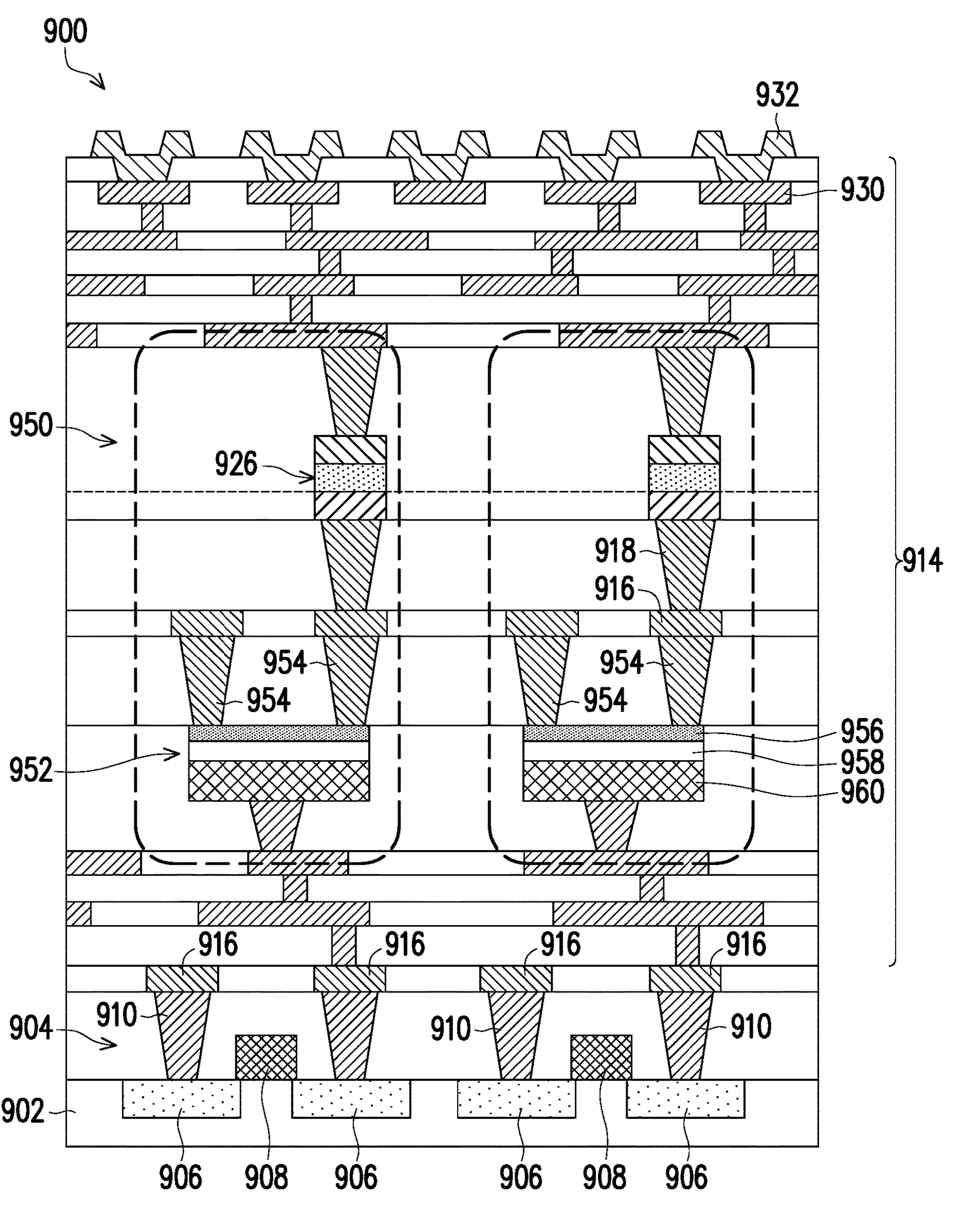
FIG. 10 is the semiconductor device structure of FIG. 9G, in accordance with alternative embodiments.

FIG. 10 is the semiconductor device structure 900 of FIG. 9G, in accordance with alternative embodiments. As shown in FIG. 10, FeRAM cells 950 are formed in the interconnect structure 914. Each FeRAM cell 950 includes a transistor 952 electrically connected to a capacitor 926. Each transistor 952 may be a thin film transistor (TFT) that is formed in BEOL processes. Each transistor 952 includes source/drain regions 954, a metal oxide layer 956, a gate dielectric layer 958, and a gate electrode 960. The source/drain region 954 may include an electrically conductive material, such as a metal or metal nitride. In some embodiments, the source/drain region 954 includes TiN, TaN, W, or WN. The metal oxide layer 956 serves as the channel region of the TFT. In some embodiments, the metal oxide layer 956 includes a metal oxide semiconductor material, such as indium gallium zinc oxide (IGZO), doped zinc oxide, doped indium oxide, doped cadmium, or other suitable metal oxide semiconductor material. The gate dielectric layer 958 may include the same material as the gate dielectric layer 104*d* of FIG. 1B, and the gate electrode 960 may include the same material as the gate electrode 104*c* of FIG. 1B. The transistor 952 is electrically connected to the capacitor by the conductive lines 916 and conductive vias 918.

Figure 11B:
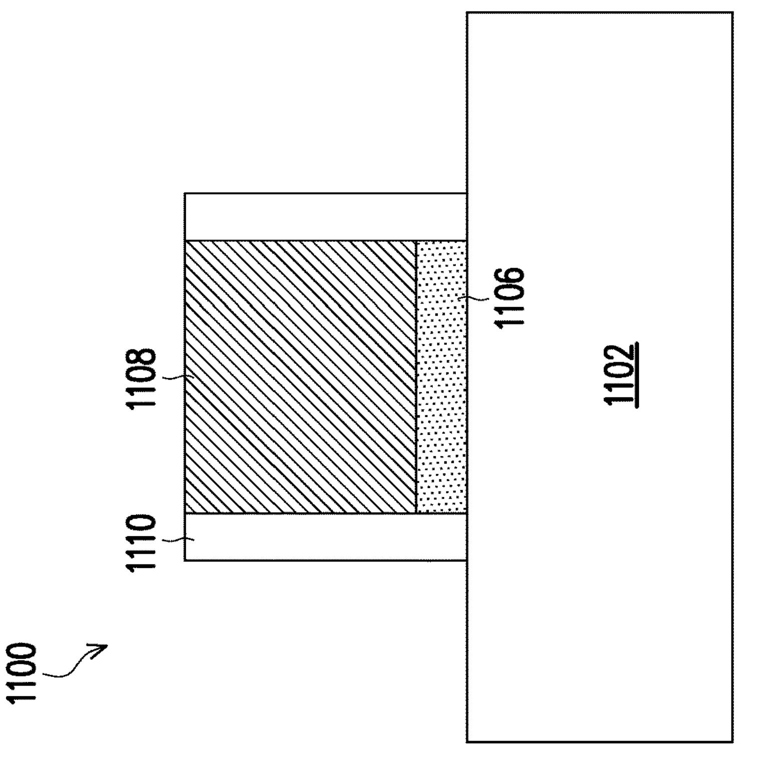
FIGS. 11A-11F are cross-sectional side views of various manufacturing stages of a transistor, in accordance with some embodiments.
Figure 11A:
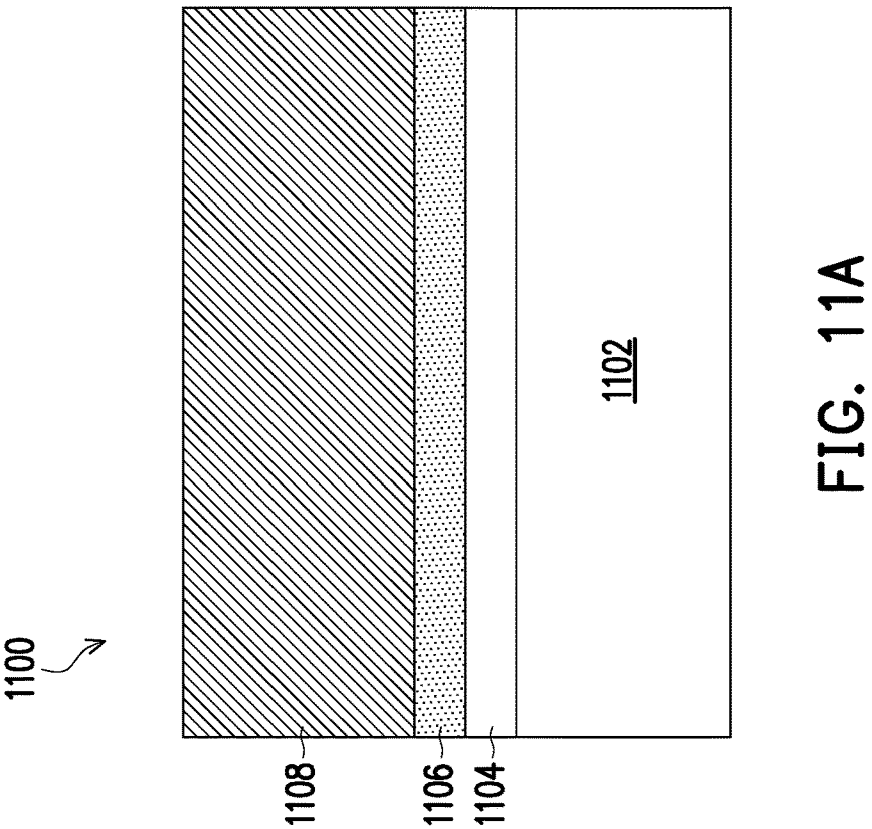
Figure 11D:
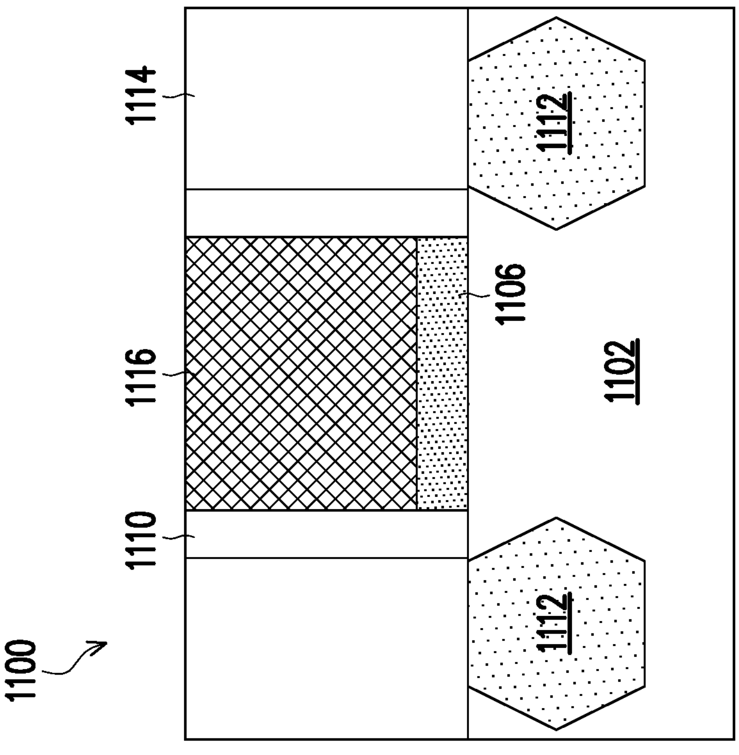
Figure 11C:
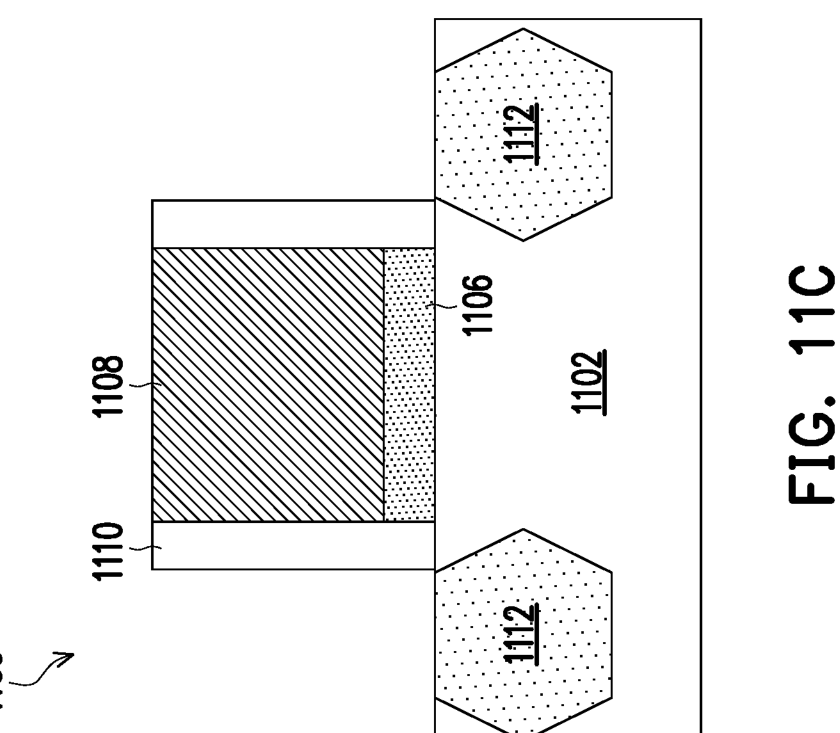

FIGS. 11A-11F are cross-sectional side views of various manufacturing stages of a transistor 1100, in accordance with some embodiments. As shown in FIG. 11A, an optional interfacial layer 1104 is formed on a substrate 1102, a ferroelectric layer 1106 is formed on the interfacial layer 1104, and a dummy gate 1108 is formed on the ferroelectric layer 1106. The substrate 1102 may include the same material as the substrate 202 of FIG. 2B and the ferroelectric layer 1106 may include the same material as the ferroelectric layer 704 of FIGS. 7A to 7C or the ferroelectric layer 804 of FIGS. 8A to 8C. The dummy gate 1108 may include polycrystalline silicon. Next, as shown in FIG. 11B, the ferroelectric layer 1106 and the dummy gate 1108 are patterned (the interfacial layer 1104 is omitted). Gate spacers 1110 are formed on sides of the dummy gate 1108 and the ferroelectric layer 1106. Next, as shown in FIG. 11C, source/drain regions 1112 are formed on opposite sides of the dummy gate 1108. The source/drain regions 1112 may include the same material as the source region 204*a* and the drain region 204*b* of FIG. 2B. Next, as shown in FIG. 11D, ILD layer 1114 is formed over the source/drain regions 1112. In some embodiments, a contact etch stop layer (CESL) (not shown) is formed on the source/drain regions 1112, and the ILD layer 1114 is formed on the CESL. The dummy gate 1108 is then removed, and a gate electrode 1116 is formed on the ferroelectric layer 1106. The gate electrode 1116 may include the same material as the gate electrode 204*c* of FIG. 2B.

Figure 11F:
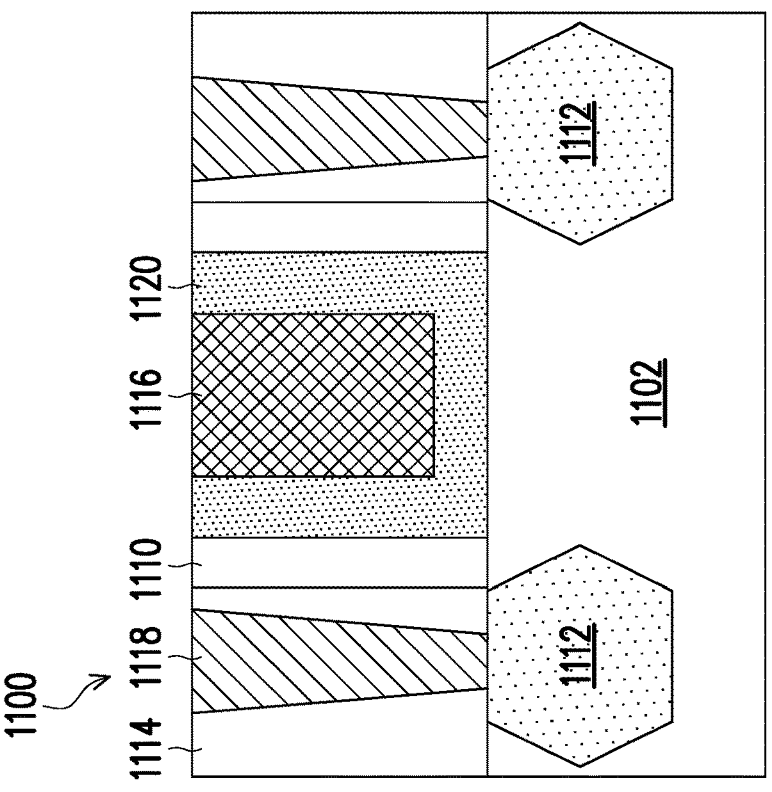
Figure 11E:
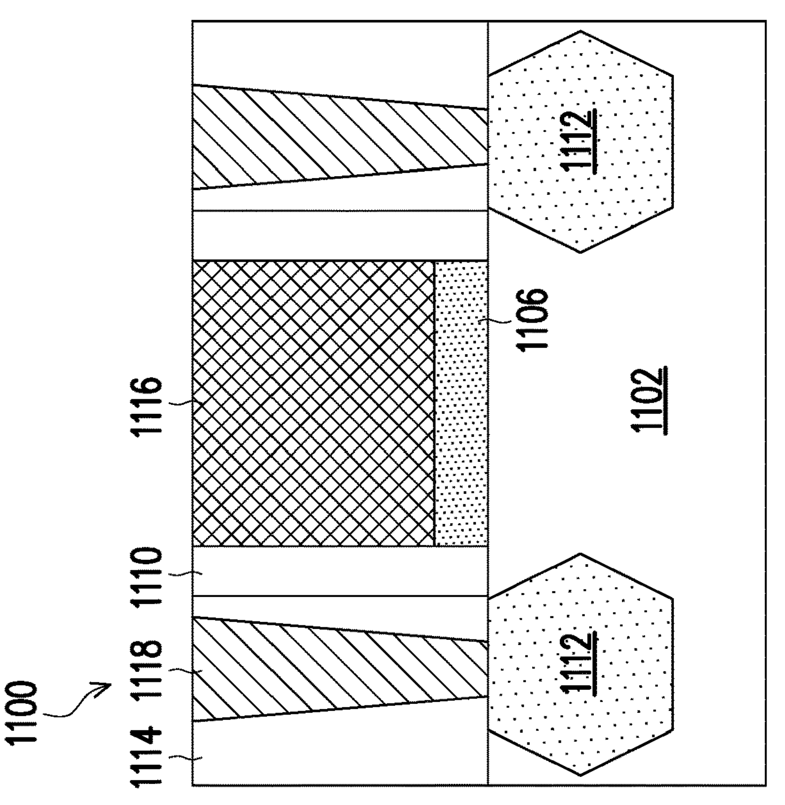

Next, as shown in FIG. 11E, conductive contacts 1118 are formed in the ILD layer 1114. The conductive contacts 1118 are electrically connected to the source/drain regions 1112. In some embodiments, a silicide layer (not shown) are formed between the conductive contact 1118 and the source/drain region 1112. In some embodiments, the ferroelectric layer 1106 is removed during the removal of the dummy gate 1108, and another ferroelectric layer 1120 is formed prior to forming the gate electrode 1116, as shown in FIG. 11F. The ferroelectric layer 1120 may include the same material as the ferroelectric layer 704 in FIGS. 7A to 7C or the ferroelectric layer 804 in FIGS. 8A to 8C. In the embodiment shown in FIG. 11F, the ferroelectric layer 1106 may be a sacrificial layer and may be a high-k dielectric layer which does not exhibit ferroelectricity.

The transistor 1100 is a FeFET including the ferroelectric layer 1106 or the ferroelectric layer 1120. The ferroelectric layer 1106 or ferroelectric layer 1120 is formed by the processes described in FIGS. 7A to 7C or in FIGS. 8A to 8C. The ferroelectricity of the ferroelectric layer 1106 or ferroelectric layer 1120 is improved, leading to improved device performance and reliability.

Figure 12:
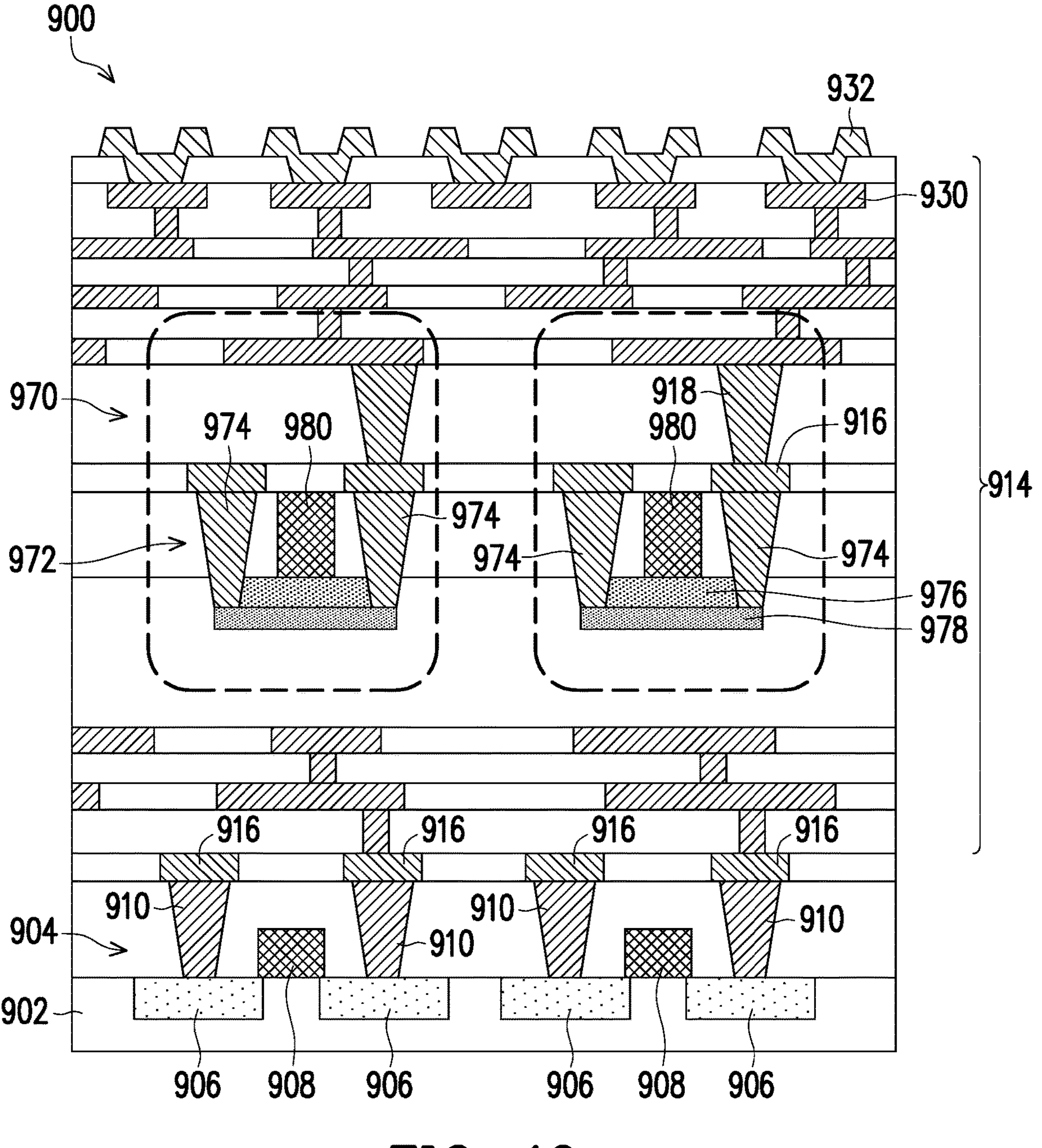
FIG. 12 is the semiconductor device structure of FIG. 9G, in accordance with alternative embodiments.

FIG. 12 is the semiconductor device structure 900 of FIG. 9G, in accordance with alternative embodiments. As shown in FIG. 12, instead of having the capacitors 926 in the interconnect structure 914, FeFET cells 970 are formed in the interconnect structure 914. The FeFET cells 970 includes a FeFET 972. The FeFET 972 includes source/drain regions 974, a ferroelectric layer 976, a metal oxide layer 978, and a gate electrode 980. The source/drain regions 974 may include the same material as the source/drain regions 954 of FIG. 10. The ferroelectric layer 976 may include the same material as the ferroelectric layer 704 of FIGS. 7A to 7C or the ferroelectric layer 804 of FIGS. 8A to 8C. The metal oxide layer 978 may include the same material as the metal oxide layer 956 of FIG. 10, and the gate electrode 980 may include the same material as the gate electrode 960. The FeFET 972 may be a TFT.

Figure 13:
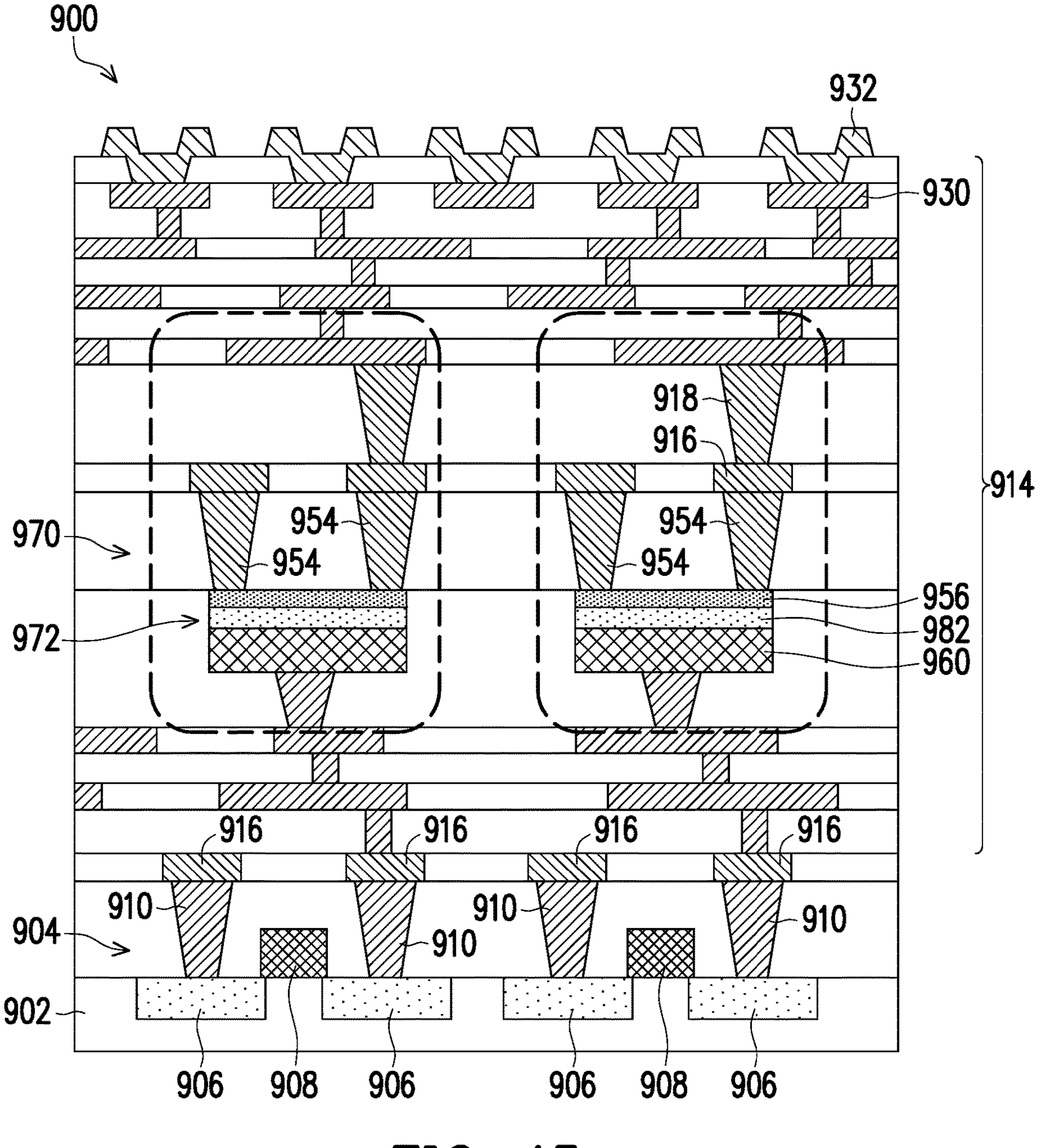
FIG. 13 is the semiconductor device structure of FIG. 12, in accordance with alternative embodiments.

FIG. 13 is the semiconductor device structure 900 of FIG. 12, in accordance with alternative embodiments. As shown in FIG. 13, the FeFET 972 may be substantially the same as the transistor 952 shown in FIG. 10. However, instead of having the gate dielectric layer 958, the FeFET 972 includes a ferroelectric layer 982 disposed between the metal oxide layer 956 and the gate electrode 960. The ferroelectric layer 982 may include the same material as the ferroelectric layer 402 in FIG. 4, the ferroelectric layer 704 in FIGS. 7A to 7C, or the ferroelectric layer 804 in FIGS. 8A to 8C. In some embodiments, the gate electrode 960 includes the same material as the monocrystalline metal layer 404 in FIG. 4. Similar to the transistor 1100, the FeFET 972 includes the ferroelectric layer 976 or the ferroelectric layer 982. The ferroelectric layer 976 or ferroelectric layer 982 is formed by the processes described in FIG. 4, FIGS. 7A to 7C, or FIGS. 8A to 8C. The ferroelectricity of the ferroelectric layer 976 or ferroelectric layer 982 is improved, leading to improved device performance and reliability.

The ferroelectric layer formed by the processes described in FIGS. 4, 7A to 7C, or 8A to 8C has improved ferroelectricity. The ferroelectric layer may be utilized in FeRAM, FeFET, or other suitable device.

The present disclosure provides a ferroelectric layer having improved ferroelectricity. In some embodiments, the ferroelectric layer is formed on a monocrystalline metal layer, and the ferroelectric layer includes over 90 percent of orthorhombic phase. In some embodiments, UHV anneal process or ion implantation process is performed after depositing the ferroelectric layer in order to increase the percentage of orthorhombic phase and/or to increase space within the layer for the atoms to move. Some embodiments may achieve advantages. For example, improved ferroelectricity in the ferroelectric layer leads to improved device performance and device reliability.

An embodiment is a method. The method includes depositing a doped hafnium dioxide layer on a layer, and the doped hafnium dioxide layer has a first oxygen vacancy concentration. The method further includes performing an ultra-high vacuum anneal process on the doped hafnium dioxide layer to increase the first oxygen vacancy concentration to a second oxygen vacancy concentration and performing an oxygen anneal process on the doped hafnium dioxide layer to decrease the second oxygen vacancy concentration.

Another embodiment is a method. The method includes depositing a doped hafnium dioxide layer on a layer, and the doped hafnium dioxide layer is partially crystallized with a first crystal phase. The method further includes performing an ion implantation process on the doped hafnium dioxide layer to amorphized the doped hafnium dioxide layer and performing an anneal process on the doped hafnium dioxide layer to crystallize the doped hafnium dioxide layer with a second crystal phase.

A further embodiment is semiconductor device structure. The structure includes a transistor disposed over a substrate, an interconnect structure disposed over the transistor, and a ferroelectric capacitor (FeCAP) disposed in the interconnect structure. The FeCAP includes a first metal layer, and the first metal layer is a monocrystalline metal layer. The FeCAP further includes a ferroelectric layer disposed on the first metal layer, and the ferroelectric layer includes over 90 percent of orthorhombic phase. The FeCAP further includes a second metal layer disposed on the ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
- depositing a doped hafnium dioxide layer on a layer, wherein the doped hafnium dioxide layer has a first oxygen vacancy concentration, and the doped hafnium dioxide layer comprises a dopant selected from the group consisting of aluminum, lanthanum, titanium, tantalum, silicon, yttrium, scandium, gadolinium, and combinations thereof;
- performing an ultra-high vacuum anneal process on the doped hafnium dioxide layer to increase the first oxygen vacancy concentration to a second oxygen vacancy concentration, wherein a processing pressure of the ultra-high vacuum anneal process is less than 1e-3 Torr; and
- performing an oxygen anneal process on the doped hafnium dioxide layer to decrease the second oxygen vacancy concentration.

2. The method of claim 1, wherein the first oxygen vacancy concentration ranges from about 2 percent to about 5 percent.

3. The method of claim 2, wherein the second oxygen vacancy concentration ranges from about 5 percent to about 10 percent.

4. The method of claim 1, wherein the layer is a first metal layer.

5. The method of claim 4, further comprising forming a second metal layer on the doped hafnium dioxide layer after the oxygen anneal process.

6. The method of claim 1, wherein the layer is an interfacial layer disposed on a substrate.

7. The method of claim 6, further comprising:
- forming a dummy gate on the doped hafnium dioxide layer;
- forming gate spacers on sides of the dummy gate and the doped hafnium dioxide layer;
- forming source/drain regions in the substrate;
- removing the dummy gate; and
- forming a gate electrode on the doped hafnium dioxide layer.

8. A method, comprising:
- depositing a doped hafnium dioxide layer on a layer, wherein the doped hafnium dioxide layer is partially crystallized with a first crystal phase, and a first dopant is introduced into the doped hafnium dioxide layer during the depositing of the doped hafnium dioxide layer, wherein the first dopant is selected from the group consisting of aluminum, lanthanum, titanium, tantalum, silicon, yttrium, scandium, gadolinium, and combinations thereof;
- performing an ion implantation process on the doped hafnium dioxide layer to amorphize the doped hafnium dioxide layer, wherein a second dopant is introduced into the doped hafnium dioxide layer during the ion implantation process, and the second dopant is selected from the group consisting of phosphorous, arsenic, boron, gallium, antimony, germanium, and silicon; and
- performing an anneal process on the doped hafnium dioxide layer to crystallize the doped hafnium dioxide layer with a second crystal phase, wherein the doped hafnium dioxide layer is a ferroelectric layer.

9. The method of claim 8, wherein the first crystal phase is monoclinic and the second crystal phase is orthorhombic.

10. The method of claim 8, wherein the layer is a first metal layer.

11. The method of claim 10, further comprising forming a second metal layer on the doped hafnium dioxide layer before the anneal process.

12. The method of claim 8, wherein the layer is an interfacial layer disposed on a substrate.

13. The method of claim 12, further comprising:
- forming a dummy gate on the doped hafnium dioxide layer;
- forming gate spacers on sides of the dummy gate and the doped hafnium dioxide layer;
- forming source/drain regions in the substrate;
- removing the dummy gate; and
- forming a gate electrode on the doped hafnium dioxide layer.

14. A method, comprising:
- depositing a doped hafnium dioxide layer on a layer, wherein the doped hafnium dioxide layer has a first oxygen vacancy concentration, and the doped hafnium dioxide layer comprises a dopant selected from the group consisting of aluminum, lanthanum, titanium, tantalum, silicon, yttrium, scandium, gadolinium, and combinations thereof; and performing an ultra-high vacuum anneal process on the doped hafnium dioxide layer to increase the first oxygen vacancy concentration to a second oxygen vacancy concentration, wherein the ultra-high vacuum anneal process is performed at a processing temperature ranging from about 20 degrees Celsius to about 450 degrees Celsius and at a processing pressure less than 1e-3 Torr.

15. The method of claim 14, wherein a dopant concentration of the doped hafnium dioxide layer ranges from about 0.1 mole percent to about 15 mole percent.

16. The method of claim 14, wherein the first oxygen vacancy concentration ranges from about 2 percent to about 5 percent.

17. The method of claim 16, wherein the second oxygen vacancy concentration ranges from about 5 percent to about 10 percent.

18. The method of claim 14, wherein the ultra-high vacuum anneal process is performed at a processing pressure ranging from about $1e^{-8}$ Torr to about $1e^{-3}$ Torr.

19. The method of claim 18, wherein the ultra-high vacuum anneal process is performed at a processing temperature ranging from about 20 degrees Celsius to about 450 degrees Celsius.

20. The method of claim 19, further comprising performing an oxygen anneal process on the doped hafnium dioxide layer to decrease the second oxygen vacancy concentration.

* * * * *